United States Patent
Sasaki et al.

(10) Patent No.: US 12,453,124 B2
(45) Date of Patent: Oct. 21, 2025

(54) THIN FILM TRANSISTOR SUBSTRATE, DISPLAY DEVICE, AND MANUFACTURING METHOD FOR THIN FILM TRANSISTOR SUBSTRATE

(71) Applicant: Sharp Display Technology Corporation, Kameyama (JP)

(72) Inventors: Kazunari Sasaki, Kameyama (JP); Kimihiko Hayashi, Kameyama (JP); Ryuji Matsumoto, Kameyama (JP); Takashi Terauchi, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 515 days.

(21) Appl. No.: 17/964,823

(22) Filed: Oct. 12, 2022

(65) Prior Publication Data
US 2023/0120056 A1    Apr. 20, 2023

(30) Foreign Application Priority Data
Oct. 19, 2021    (JP) .................. 2021-170986

(51) Int. Cl.
*H10D 30/67*    (2025.01)
*H10D 30/01*    (2025.01)
*H10D 86/40*    (2025.01)

(52) U.S. Cl.
CPC ..... *H10D 30/6732* (2025.01); *H10D 30/0316* (2025.01); *H10D 86/441* (2025.01)

(58) Field of Classification Search
CPC ........... H10D 30/6732; H10D 30/0316; H10D 86/441
See application file for complete search history.

(56) References Cited

U.S. PATENT DOCUMENTS

| | | | | |
|---|---|---|---|---|
| 5,721,164 A * | 2/1998 | Wu | ..................... | H10D 30/0316 438/159 |
| 2006/0284176 A1* | 12/2006 | Fang | .................. | H10D 30/6732 257/59 |
| 2007/0004070 A1* | 1/2007 | Chae | ...................... | H10D 86/00 438/30 |
| 2009/0090910 A1 | 4/2009 | Moriwaki | | |
| 2011/0089423 A1* | 4/2011 | Kwon | ..................... | H10D 86/00 257/59 |
| 2011/0318891 A1* | 12/2011 | Oda | ................... | H10D 30/0316 438/166 |

(Continued)

FOREIGN PATENT DOCUMENTS

JP    5079512 B2    11/2012

*Primary Examiner* — Peter M Albrecht
(74) *Attorney, Agent, or Firm* — ScienBiziP, P.C.

(57) ABSTRACT

A thin film transistor substrate includes a substrate and a bottom gate-type thin film transistor, in which a gate insulating film is provided, a gate electrode is made of a first conductive film disposed on a lower layer side of the gate insulating film, the gate insulating film includes a first insulating portion overlapping the gate electrode and a second insulating portion that is disposed not to overlap the gate electrode but to overlap the source electrode and the drain electrode, and has a film thickness greater than a film thickness of the first insulating portion, and a lower layer portion that is made of a lower layer film disposed on a lower layer side of the first conductive film and has at least a portion overlapping the gate electrode is provided.

8 Claims, 36 Drawing Sheets

(56) References Cited

U.S. PATENT DOCUMENTS

2013/0270563 A1* 10/2013 Yamazaki ............ H10D 30/031
257/57
2016/0351596 A1* 12/2016 Liao ................... H10D 30/6732

* cited by examiner

THIN FILM TRANSISTOR SUBSTRATE, DISPLAY DEVICE, AND MANUFACTURING METHOD FOR THIN FILM TRANSISTOR SUBSTRATE

CROSS-REFERENCE TO RELATED APPLICATIONS

This application claims the benefit of priority to Japanese Patent Application Number 2021-170986 filed on Oct. 19, 2021. The entire contents of the above-identified application are hereby incorporated by reference.

BACKGROUND

Technical Field

The technique disclosed in the present specification relates to a thin film transistor substrate, a display device, and a manufacturing method for the thin film transistor substrate.

A display device described in JP 5079512 B below is known as an example of a display device such as a liquid crystal display device in the related art. The display device described in JP 5079512 B includes pixel auxiliary capacitors and pixel TFTs as a plurality of thin film elements. The pixel auxiliary capacitors and the pixel TFTs each include a lower electrode, an insulating film, and an upper electrode in this order on a glass substrate. Each upper electrode facing the respective lower electrode is entirely surrounded by the outer shape of the lower electrodes in a plan view.

SUMMARY

The pixel TFTs of the display device described in JP 5079512 B mentioned above are of a so-called top gate type in which the upper electrodes are gate electrodes and the lower electrodes are source electrodes and drain electrodes. In the display device according to JP 5079512 B, the upper electrodes constituting a top gate-type pixel TFT are disposed such that the upper electrodes are entirely surrounded by the outer shape of the lower electrodes in a plan view. On the other hand, in a display device including bottom gate-type thin film transistors, the source electrodes and the drain electrodes serving as upper electrodes are generally disposed to protrude from the outer shape of the gate electrodes serving as lower electrodes. In manufacturing a display device including bottom gate-type thin film transistors, there is concern that a film residue may be generated in the conductive film when the gate electrodes are patterned. When such a film residue is electrically connected to the gate electrode and further penetrates the gate insulating film and is electrically connected to the source electrode or the drain electrode, the gate electrode and the source electrode or the drain electrode are short-circuited. When the gate electrode and the source electrode or the drain electrode are short-circuited, there is concern that a defect such as an operation failure may occur in the thin film transistor.

The technique described in the present specification has been completed based on the above-described circumstances, and aims to make a defect difficult to occur in a thin film transistor.

(1) A thin film transistor substrate according to the technique described in the present specification is a thin film transistor substrate including a substrate and a thin film transistor of a bottom gate type, the thin film transistor including a gate electrode, a channel portion, a source electrode, and a drain electrode formed on the substrate, in which a gate insulating film disposed between the gate electrode and the channel portion is provided, the gate electrode is made of a first conductive film disposed on a lower layer side of the gate insulating film, the channel portion is made of a semiconductor film disposed on an upper layer side of the gate insulating film, and the channel portion is disposed to overlap the gate electrode, the source electrode is made of a second conductive film disposed on an upper layer side of the semiconductor film, and the source electrode is disposed to include at least a part overlapping the channel portion, the drain electrode is made of a different portion of the second conductive film from a portion of the source electrode and disposed to include at least a part overlapping the channel portion at a position spaced from the source electrode, the gate insulating film includes a first insulating portion overlapping the gate electrode and a second insulating portion that is disposed not to overlap the gate electrode but to overlap the source electrode and the drain electrode, and that has a film thickness greater than a film thickness of the first insulating portion, and a lower layer portion that is made of a lower layer film disposed on a lower layer side of the first conductive film and includes at least a part overlapping the gate electrode is provided.

(2) Furthermore, in the thin film transistor substrate described above, the lower layer portion may include an overlapping portion overlapping the gate electrode and a non-overlapping portion not overlapping the gate electrode, in addition to the configuration (1) described above.

(3) Furthermore, the thin film transistor substrate may further include a first wiring line made of a different portion of the first conductive film from a portion of the gate electrode, a second wiring line made of a different portion of the second conductive film from the portion of the source electrode and a portion of the drain electrode, the second wiring line intersecting the first wiring line, and a third insulating portion made of a different portion of the gate insulating film from a portion of the first insulating portion and a portion of the second insulating portion, the third insulating portion interposed between the first wiring line and the second wiring line at an intersection of the first wiring line and the source wiring line, the third insulating portion having a film thickness identical to a film thickness of the second insulating portion, in addition to the configuration (2) described above.

(4) Furthermore, the thin film transistor substrate may further include a plurality of terminal portions made of a different portion of the first conductive film from a portion of the gate electrode, the plurality of terminal portions arranged at intervals, and a second lower layer portion made of a different portion of the lower layer film from a portion of the lower layer portion, the second lower layer portion disposed to include at least a part overlapping at least one of the plurality of terminal portions, in addition to any one of the configurations (1) to (3) described above.

(5) Furthermore, in the thin film transistor substrate described above, the gate insulating film may include a first gate insulating film disposed on an upper layer side of the first conductive film and a second gate insulating film disposed on an upper layer side of the first gate insulating film, the first insulating portion may include the second gate insulating film without including the first gate insulating film, and the second insulating portion may include the first gate insulating film and the second gate insulating film, in addition to any one of the configurations (1) to (4) described above.

(6) Furthermore, in the thin film transistor substrate described above, the gate insulating film may include a first gate insulating film disposed on an upper layer side of the first conductive film and a second gate insulating film disposed on an upper layer side of the first gate insulating film, the first insulating portion may include at least the second gate insulating film, the second insulating portion may include the first gate insulating film and the second gate insulating film, a portion of the second insulating portion constituted by the first gate insulating film may have a film thickness that is equal to or greater than a sum of a thickness of the lower layer portion and a thickness of the gate electrode, and an upper surface of the first insulating portion and an upper surface of the second insulating portion may constitute one flat surface, in addition to any one of the configurations (1) to (4) described above.

(7) Furthermore, in the thin film transistor substrate described above, the portion of the second insulating portion constituted by the first gate insulating film may have a film thickness greater than the sum, and the first insulating portion may include the first gate insulating film, in addition to the configuration (6) described above.

(8) Furthermore, the thin film transistor substrate may further include a gate wiring line made of a different portion of the first conductive film from a portion of the gate electrode, the gate wiring line connected to the gate electrode, in which the lower layer portion may be made of a conductive material, in addition to any one of the configurations (1) to (7) described above.

(9) A display device according to the technique described in the present specification includes a thin film transistor substrate according to any one of the configurations (1) to (8) described above, and a counter substrate disposed to face the thin film transistor substrate.

(10) A manufacturing method for a thin film transistor substrate according to the technique described in the present specification includes forming a lower layer film on a substrate and patterning the lower layer film to provide a lower layer portion, forming a first conductive film on an upper layer side of the lower layer film and patterning the first conductive film to provide a gate electrode overlapping at least a portion of the lower layer portion, the gate electrode constituting a thin film transistor of a bottom gate type, forming a gate insulating film on an upper layer side of the first conductive film and patterning a portion of the gate insulating film overlapping the gate electrode to be selectively etched to provide a first insulating portion overlapping the gate electrode and a second insulating portion disposed not to overlap the gate electrode, the second insulating portion having a film thickness greater than a film thickness of the first insulating portion, forming a semiconductor film on an upper layer side of the gate insulating film and patterning the semiconductor film to provide a channel portion disposed to overlap the gate electrode, the channel portion constituting the thin film transistor, and forming a second conductive film on an upper layer side of the semiconductor film and patterning the second conductive film to provide a source electrode disposed to include at least a portion overlapping the channel portion, the source electrode constituting the thin film transistor, and a drain electrode disposed to include at least a portion overlapping the channel portion at a position spaced from the source electrode, the drain electrode constituting the thin film transistor.

(11) A manufacturing method for a thin film transistor substrate according to the technique described in the present specification includes forming a lower layer film on a substrate and patterning the lower layer film to provide a lower layer portion, forming a first conductive film on an upper layer side of the lower layer film and patterning the first conductive film to provide a gate electrode overlapping at least a portion of the lower layer portion, the gate electrode constituting a thin film transistor of a bottom gate type, forming a first gate insulating film on an upper layer side of the first conductive film, patterning a portion of the first gate insulating film overlapping the gate electrode to be selectively etched, and then forming a second gate insulating film on an upper layer side of the first gate insulating film to provide a first insulating portion overlapping the gate electrode, the first insulating portion at least including the second gate insulating film, and a second insulating portion disposed not to overlap the gate electrode, the second insulating portion including the first gate insulating film and the second gate insulating film, the second insulating portion having a film thickness greater than a film thickness of the first insulating portion, forming a semiconductor film on an upper layer side of the second gate insulating film and patterning the semiconductor film to provide a channel portion disposed to overlap the gate electrode, the channel portion constituting the thin film transistor, and forming a second conductive film on an upper layer side of the semiconductor film and patterning the second conductive film to provide a source electrode disposed to include at least a portion overlapping the channel portion, the source electrode constituting the thin film transistor and a drain electrode disposed to include at least a portion overlapping the channel portion at a position spaced from the source electrode, the drain electrode constituting the thin film transistor.

(12) Furthermore, in the above-described manufacturing method for a thin film transistor substrate, in the patterning the first gate insulating film, the portion of the first gate insulating film overlapping the gate electrode may be removed, in addition to the configuration (11) described above.

(13) Furthermore, in the above-described manufacturing method for a thin film transistor substrate, in the forming the first gate insulating film, a film thickness of the first gate insulating film may be set to be equal to or greater than a sum of a thickness of the lower layer portion and a thickness of the gate electrode, and in the patterning the first gate insulating film, the portion of the first gate insulating film overlapping the gate electrode and forming the first insulating portion may be left, and an upper surface of a portion of the first gate insulating film constituting the first insulating portion and an upper surface of a portion of the first gate insulating film constituting the second insulating portion may constitute one flat surface, in addition to the configuration (11) described above.

According to the technique described in the present specification, a defect can be made less likely to occur in the thin film transistor.

BRIEF DESCRIPTION OF DRAWINGS

The disclosure will be described with reference to the accompanying drawings, wherein like numbers reference like elements.

DESCRIPTION OF EMBODIMENTS

First Embodiment

A first embodiment will be described with reference to FIG. 1 to FIG. 14B. In the present embodiment, a liquid crystal panel (display device) 10 will be exemplified. Note that an X axis, a Y axis, and a Z axis are illustrated in part of each drawing, and each axial direction is illustrated to represent a direction in each drawing.

Figure 1:
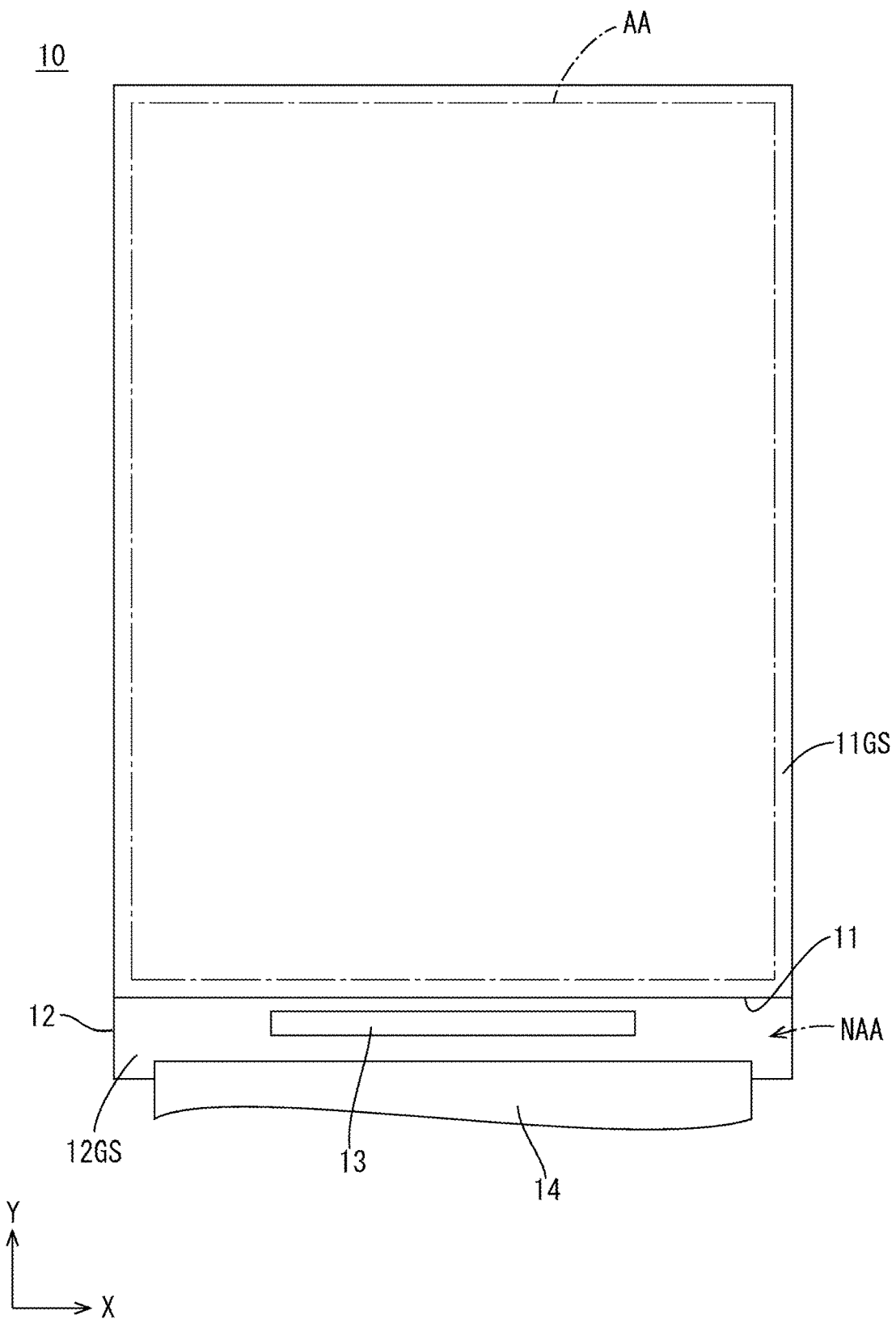
FIG. 1 is a plan view of a liquid crystal panel according to a first embodiment.

FIG. 1 is a plan view of the liquid crystal panel 10. The liquid crystal panel 10 according to the present embodiment has a planar shape being a vertically elongated substantially rectangular shape as a whole as illustrated in FIG. 1. Note that the planar shape of the liquid crystal panel 10 may not only be a vertically elongated substantially rectangular shape, but may be a horizontally elongated substantial rectangular shape, a substantial square shape, or a variant (non-rectangle) such as a circular shape. A short-side direction, a long-side direction, and a plate-thickness direction of the liquid crystal panel 10 coincide with an X-axis direction, a Y-axis direction, and a Z-axis direction, respectively. The liquid crystal panel 10 can display an image by using illumination light radiated from a backlight device (illumination device). The liquid crystal panel 10 has a display region AA in which images are displayed at the center portion of the screen. A frame-shaped outer peripheral portion surrounding the display region AA on the screen of the liquid crystal panel 10 is a non-display region NAA in which no images are displayed. Further, the range surrounded by the dot-dash line in FIG. 1 is the display region AA.

The liquid crystal panel 10 includes a pair of glass substrates 11 and 12 that are almost transparent and have excellent light-transmitting properties as illustrated in FIG. 1. The liquid crystal panel 10 is configured such that a liquid crystal layer containing liquid crystal molecules that are a substance having optical characteristics that change depending on an applied electrical field is sandwiched between the pair of substrates 11 and 12. Among the pair of substrates 11 and 12, the substrate disposed on the front side is a counter substrate (a CF substrate) 11, and the substrate disposed on the back side is an array substrate (a thin film transistor substrate) 12. The counter substrate 11 and the array substrate 12 are both assumed to be formed by layering various films on the inner surface sides of glass substrates (substrates or underlayers) 11GS and 12GS. The glass substrates 11GS and 12GS contain, for example, alkali-free glass as a main material. Among these, the array substrate 12 has a long side dimension greater than a long side dimension of the counter substrate 11, and one end portion in the long-side direction does not overlap the counter substrate 11, and a driver (a signal supply unit) 13 and a flexible substrate 14 are mounted at the one end portion of the array substrate 12 (mounting region). The driver 13 is made of an LSI chip having a drive circuit inside. The driver 13 processes various signals transmitted by the flexible substrate 14. The driver 13 is mounted in the mounting region of the array substrate 12 in a Chip-On-Glass (COG) manner. The flexible substrate 14 has a configuration in which many wiring line patterns (not illustrated) are formed on a substrate made of a synthetic resin material (for example, a polyimide resin or the like) having insulating properties and flexibility. One end side of the flexible substrate 14 is connected to the array substrate 12, and the other end side thereof is connected to an external control substrate (a signal supply source). Various signals supplied from the control substrate are transmitted to the liquid crystal panel 10 via the flexible substrate 14. A terminal portion 25 that is electrically connected to the driver 13 and the flexible substrate 14 is provided in the mounting region of the array substrate 12. The terminal portion 25 will be described in detail later.

Figure 2:
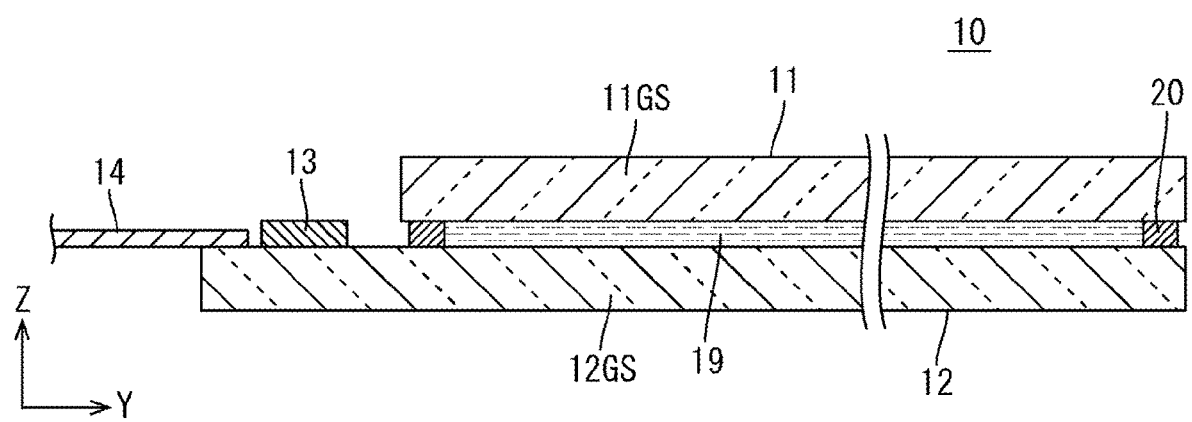
FIG. 2 is a cross-sectional view of the liquid crystal panel.

FIG. 2 is a schematic cross-sectional view of the liquid crystal panel 10. The liquid crystal panel 10 includes a liquid crystal layer (a medium layer) 19 filling the internal space between the pair of substrates 11 and 12 as illustrated in FIG. 2. The liquid crystal layer 19 includes liquid crystal molecules that are a substance having optical characteristics changing according to an applied electric field. The liquid crystal layer 19 is sealed by a sealing portion 20 surrounding the internal space between the pair of substrates 11 and 12. The sealing portion 20 is disposed in the non-display region NAA, and is formed in a rectangular frame shape (an endless ring shape) to surround the entire circumference of the internal space between both the substrates 11 and 12.

Figure 3:
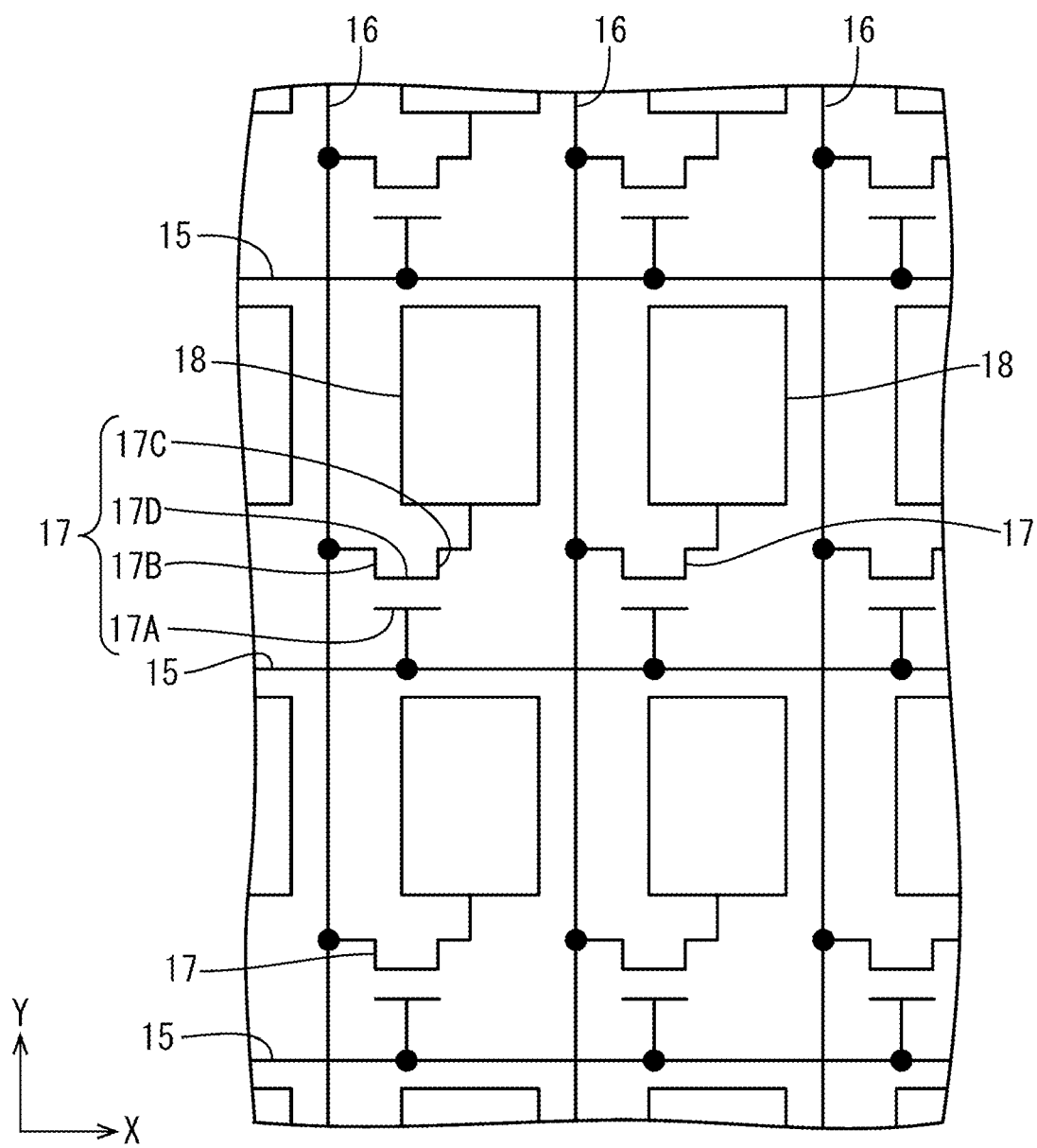
FIG. 3 is a circuit diagram illustrating an arrangement of pixels in the liquid crystal panel.

FIG. 3 is a circuit diagram illustrating an arrangement of pixels in the display region AA of the array substrate 12. A plurality of gate wiring lines (first wiring lines or scanning wiring lines) 15 and a plurality of source wiring lines (second wiring lines or image wiring lines) 16 forming a lattice pattern are disposed on the inner surface side of the display region AA of the array substrate 12 as illustrated in FIG. 3. Thin film transistors (TFTs) 17 and pixel electrodes 18 are provided near the intersections of gate wiring lines 15 and source wiring lines 16. Each of the gate wiring lines 15 extends approximately in the X-axis direction such that the gate wiring line 15 crosses the display region AA, and is connected to a gate electrode 17A of each TFT 17. Each of the source wiring lines 16 extends approximately in the Y-axis direction such that the source wiring line 16 crosses the display region AA, and is connected to a source electrode 17B of each TFT 17. The plurality of gate wiring lines 15 are disposed side by side at intervals in the Y-axis direction. The plurality of source wiring lines 16 are disposed at intervals in the X-axis direction. A plurality of the TFTs 17 and a plurality of the pixel electrodes 18 are disposed in a plane in a matrix shape regularly in the X-axis direction and the Y-axis direction. Each of the pixel electrodes 18 is connected to a drain electrode 17C of the TFT 17. Each TFT 17 has a channel portion 17D in addition to the above-described gate electrode 17A, source electrode 17B, and drain electrode 17C. The channel portion 17D is connected to the source electrode 17B and the drain electrode 17C. In addition, when each TFT 17 is being driven based on a scanning signal supplied to the gate wiring lines 15, and the TFT 17 charges the pixel electrode 18 to a potential based on an image signal (a data signal) supplied to the source wiring lines 16. In addition, color filters, light-blocking portions (black matrix), and the like are provided on the inner surface side of the counter substrate 11 in the display region AA. The color filters are disposed such that they overlap each of the pixel electrodes 18, and exhibits three colors of red (R), green (G), and blue (B). The light-blocking portions are disposed to partition adjacent color filters and have a function of preventing the colors of the pixels from being mixed. In addition to red (R), green (G), and blue (B), four-color color filters including yellow (Y) or white (W) may also be provided.

Figure 7A:
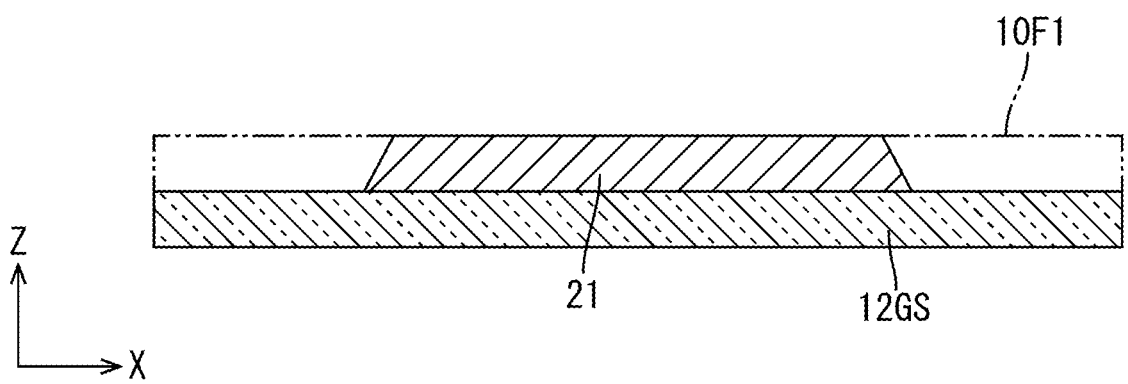
FIG. 7A is a cross-sectional view of the vicinity of the TFT illustrating a state in which a first process has been performed and a lower layer film has been patterned.
Figure 8A:
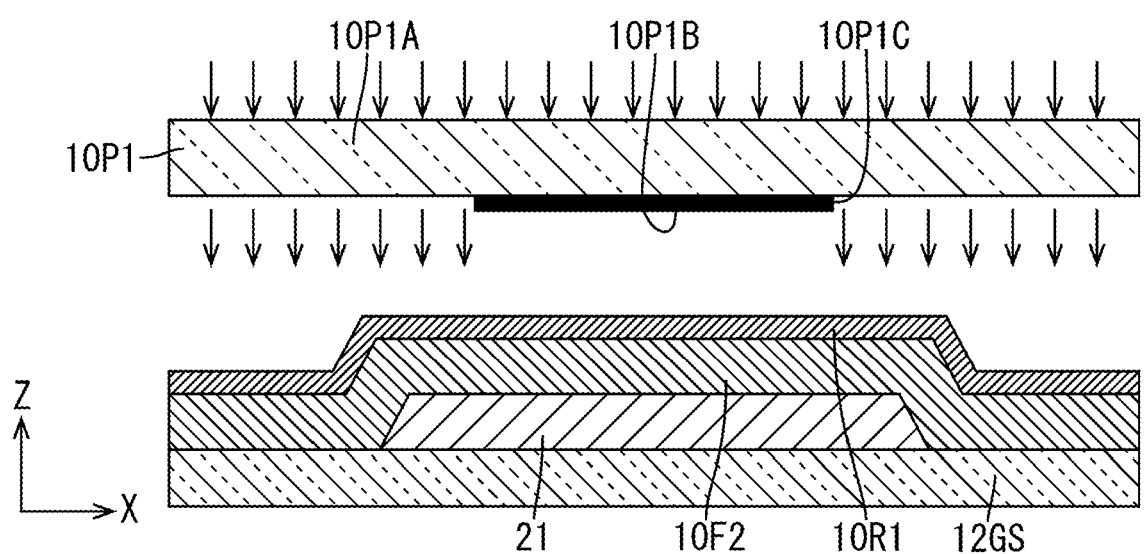
FIG. 8A is a cross-sectional view of the vicinity of the TFT illustrating a state in which a second process has been performed, a first metal film and a resist film have been formed, and the resist film is exposed.
Figure 11A:
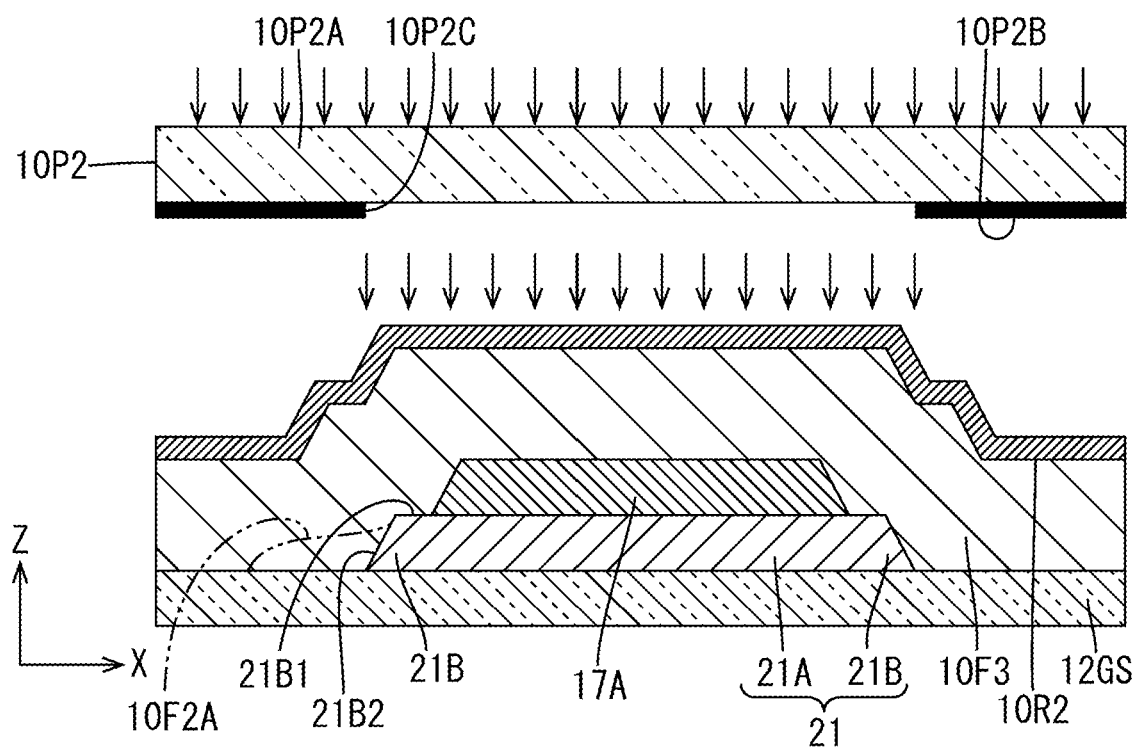
FIG. 11A is a cross-sectional view of the vicinity of the TFT illustrating a state in which a third process has been performed, a gate insulating film and a resist film have been formed, and the resist film is exposed.
Figure 13A:
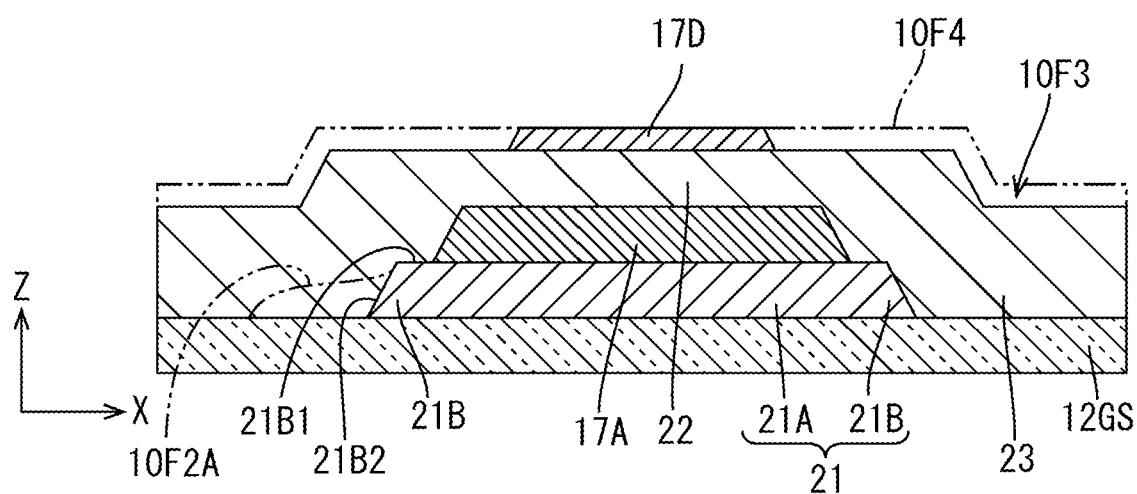
FIG. 13A is a cross-sectional view of the vicinity of the TFT illustrating a state in which a fourth process has been performed and a semiconductor film has been patterned.
Figure 14A:
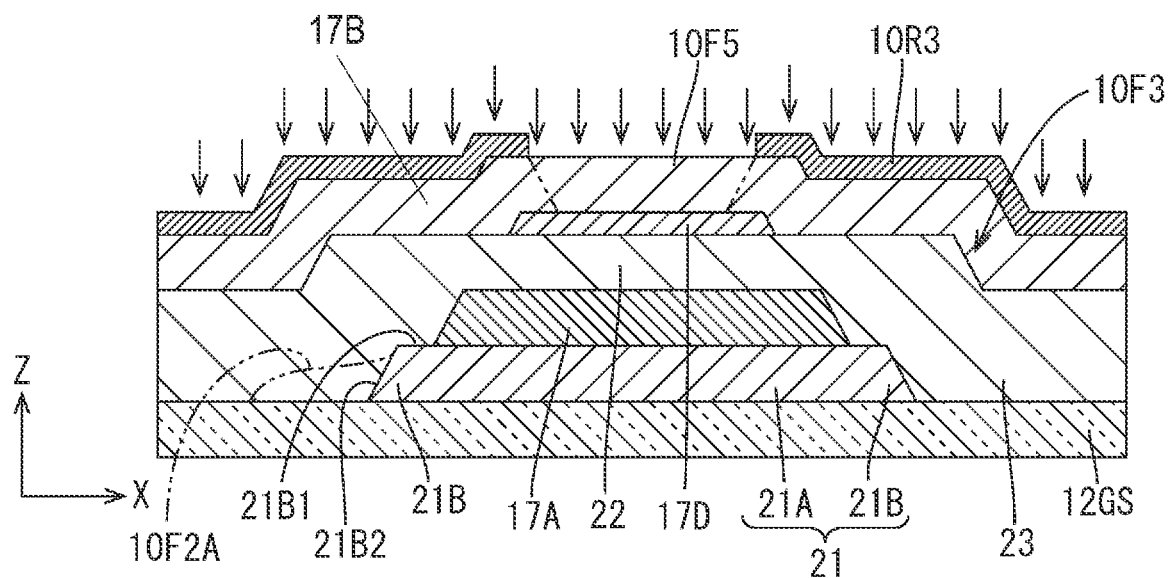
FIG. 14A is a cross-sectional view of the vicinity of the TFT illustrating a state in which a fifth process has been performed, a second metal film and a resist film have been formed, the resist film has been exposed and developed, and the second metal film is etched.

Here, various films layered on the glass substrate 12GS of the array substrate 12 will be described in detail with reference to FIGS. 7A, 8A, 11A, 13A, and 14A. All of FIGS. 7A, 8A, 11A, 13A, and 14A are cross-sectional views of a vicinity of the TFT 17 on the array substrate 12 during manufacturing. On the glass substrate 12GS of the array substrate 12, at least a lower layer film 10F1, a first metal film (a first conductive film) 10F2, a gate insulating film 10F3, a semiconductor film 10F4, and a second metal film (a second conductive film) 10F5 are layered in this order from the lower layer side (the glass substrate 12GS side), as illustrated in FIGS. 7A, 8A, 11A, 13A, and 14A. Further, the lower layer film 10F1 is illustrated in FIG. 7A, the first metal film 10F2 is illustrated in FIG. 8A, the gate insulating film 10F3 is illustrated in FIG. 11A, the semiconductor film 10F4 is illustrated in FIG. 13A, and the second metal film 10F5 is illustrated in FIG. 14A.

The lower layer film 10F1, the first metal film 10F2, and the second metal film 10F5 are made of a single layer film made of one type of metal material selected from copper, titanium, aluminum, molybdenum, tungsten, and the like, or a layered film or alloy made of different types of metal materials. The lower layer film 10F1, the first metal film 10F2, and the second metal film 10F5 have electrical conductivity. The lower layer film 10F1 constitute a lower layer portion 21 and a second lower layer portion 26, which will be described in detail later. The first metal film 10F2 constitutes the gate wiring lines 15, the gate electrodes 17A of the TFTs 17, the terminal portions 25, which will be described below, and the like. The first metal film 10F2 may be formed of the same material as the lower layer film 10F1. The second metal film 10F5 constitutes the source wiring lines 16, the source electrodes 17B and the drain electrodes 17C of the TFTs 17, and the like. The semiconductor film 10F4 is made of a thin film using a semiconductor material, for example, an oxide semiconductor, amorphous silicon, or the like as a material. The semiconductor film 10F4 constitutes the channel portions 17D of the TFTs 17 and the like. The gate insulating film 10F3 is made of an inorganic material such as silicon nitride (SiNx) or silicon oxide (SiO$_2$). The gate insulating film 10F3 is interposed between the first metal film 10F2 and the semiconductor film 10F4 as well as the second conductive film 10F5 in the Z-axis direction (layering direction) to insulate the films. Further, although not illustrated, the array substrate 12 is provided with at least a transparent electrode film constituting the pixel electrodes 18, an interlayer insulating film interposed between the transparent electrode film and the second metal film 10F5, and an alignment film, in addition to each of the films 10F1 to 10F5 described above. A contact hole for connecting the pixel electrode 18 to the drain electrode 17C is formed in the interlayer insulating film among the above-described films.

Figure 4:
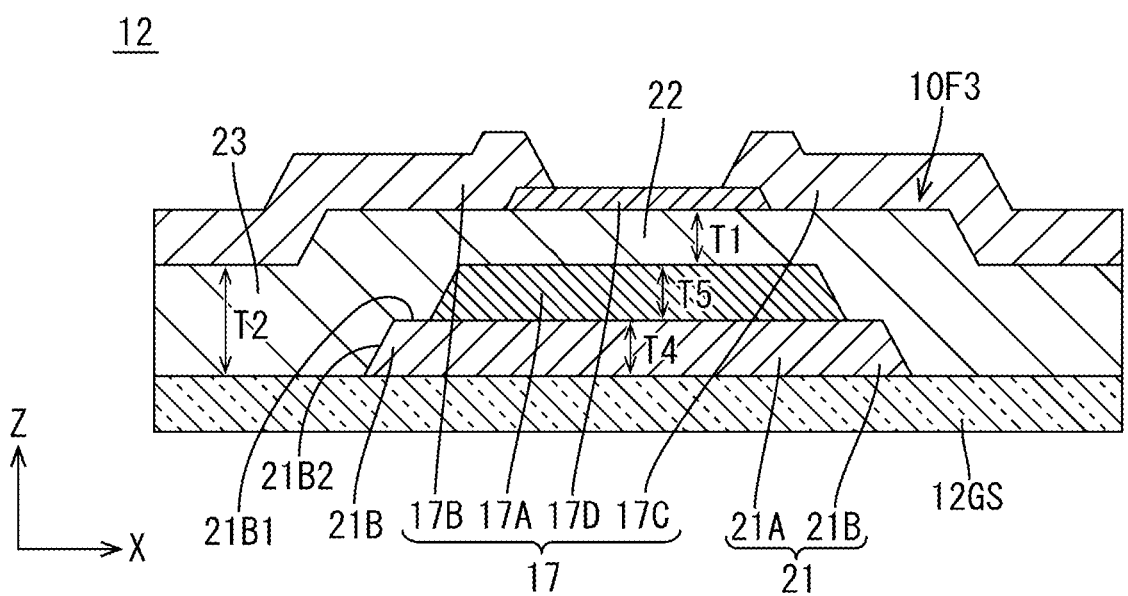
FIG. 4 is a cross-sectional view of a vicinity of a TFT in an array substrate constituting the liquid crystal panel.

A detailed configuration of the TFT 17 will be described using FIG. 4. FIG. 4 is a cross-sectional view of a vicinity of the TFT 17 in the array substrate 12. The TFT 17 according to the present embodiment is of a so-called bottom gate-type as illustrated in FIG. 4. The bottom gate-type TFT 17 has the gate electrode 17A positioned on the lower layer side of the channel portion 17D. The gate electrode 17A is made of the first metal film 10F2. The gate electrode 17A may include a portion of the gate wiring line 15 (near the intersection with the source wiring line 16). The gate electrode 17A drives the TFT 17 based on a scanning signal supplied to the gate wiring line 15. The TFT 17 includes the source electrode 17B positioned on the upper layer side of the channel portion 17D. The source electrode 17B is made of the second metal film 10F5. The source electrode 17B includes a portion of the source wiring line 16 (the intersection with the gate wiring line 15). The source electrode 17B extends in the X-axis direction, and one end portion thereof comes in contact with and is connected to the upper surface of the channel portion 17D. The TFT 17 includes the drain electrode 17C positioned on the upper layer side of the channel portion 17D. The drain electrode 17C is made of the second metal film 10F5 like the source electrode 17B. At least a portion of the drain electrode 17C extends in the X-axis direction, and one end portion thereof (on the source electrode 17B side) comes in contact with and is connected to the upper surface of the channel portion 17D. The drain electrode 17C is disposed such that one end portion thereof is spaced from one end portion of the source electrode 17B. The drain electrode 17C has the other end portion connected to the pixel electrode 18.

The TFT 17 includes the channel portion 17D positioned on the upper layer side of the gate electrode 17A and on the lower layer side of the source electrode 17B and the drain electrode 17C as illustrated in FIG. 4. The channel portion 17D is made of the semiconductor film 10F4. The channel portion 17D extends in the X-axis direction, and the entire region thereof is disposed to overlap the gate electrode 17A. One end of the channel portion 17D in the X-axis direction is connected to the source electrode 17B. The other end of the channel portion 17D in the X-axis direction is connected to the drain electrode 17C. In addition, when the TFT 17 enters an ON state based on a scanning signal supplied to the gate electrode 17A, an image signal (a data signal) supplied to the source wiring line 16 is supplied from the source electrode 17B to the drain electrode 17C via the channel portion 17D. As a result, the pixel electrode 18 is charged to the potential based on the image signal.

The lower layer portion 21 is provided on the lower layer side of the gate electrode 17A constituting the TFT 17 as illustrated in FIG. 4. The lower layer portion 21 is made of the lower layer film 10F1 disposed on the lower layer side of the first metal film 10F2. The lower layer portion 21 is disposed to have at least a portion overlapping the gate electrode 17A. The lower layer portion 21 may be disposed to overlap the gate wiring line 15 in addition to the gate electrode 17A. The lower layer portion 21 is made of the lower layer film 10F1 having electrical conductivity. For this reason, the lower layer portion 21 is electrically connected to the gate electrode 17A. As a result, wiring line resistance of the gate wiring line 15 connected to the gate electrode 17A can be reduced. The lower layer portion 21 protrudes upward from the plate surface (underlayer) of the glass substrate 12GS. The gate electrode 17A is disposed to be separated from the plate surface of the glass substrate 12GS by the lower layer portion 21. In other words, the lower layer portion 21 is interposed between the glass substrate 12GS and the gate electrode 17A in the Z-axis direction. The lower layer portion 21 includes an overlapping portion 21A overlapping the gate electrode 17A, and non-overlapping portions 21B not overlapping the gate electrode 17A. The overlapping portion 21A includes at least the center portion of the lower layer portion 21 in the X-axis direction. The non-overlapping portions 21B include at least both end portions of the lower layer portion 21 in the X-axis direction. The non-overlapping portions 21B are provided in pairs to protrude outward in the X-axis direction from both ends of the overlapping portion 21A (the gate electrode 17A) in the X-axis direction. Each non-overlapping portion 21B includes a flat surface 21B1 that is flat in the X-axis direction and the Y-axis direction, and an inclined surface 21B2 that is inclined with respect to the X-axis direction and the Z-axis direction.

A first insulating portion 22 made of the gate insulating film 10F3 is interposed between the gate electrode 17A and the channel portion 17D constituting the TFT 17 in the Z-axis direction as illustrated in FIG. 4. The first insulating portion 22 is disposed to overlap the gate electrode 17A and the channel portion 17D. A film thickness T1 of the first insulating portion 22 is an important element for determining a threshold voltage of the TFT 17. Thus, the gate insulating film 10F3 is finely processed in manufacturing of the array substrate 12 so that the film thickness T1 of the first insulating portion 22 has a target value. A second insulating portion 23 made of the gate insulating film 10F3 is interposed between the source electrode 17B as well as the drain electrode 17C constituting the TFT 17 and the glass substrate 12GS. The second insulating portion 23 is made of a different portion of the gate insulating film 10F3 from the portion of the first insulating portion 22. The second insulating portion 23 is disposed to overlap the source electrode 17B and the drain electrode 17C and not to overlap the gate electrode 17A. In addition, the second insulating portion 23 has a film thickness T2 greater than the film thickness T1 of the first insulating portion 22.

Furthermore, the second insulating portion 23 has the film thickness T2 slightly greater than the sum of a thickness T4 of the lower layer portion 21 and a thickness T5 of the gate electrode 17A (T4+T5). Because the first insulating portion 22 interposed between the gate electrode 17A and the channel portion 17D has the film thickness T1 smaller than the film thickness T2 of the second insulating portion 23, the first insulating portion 22 is suitable for lowering the threshold voltage of the TFT 17.

Figure 5:
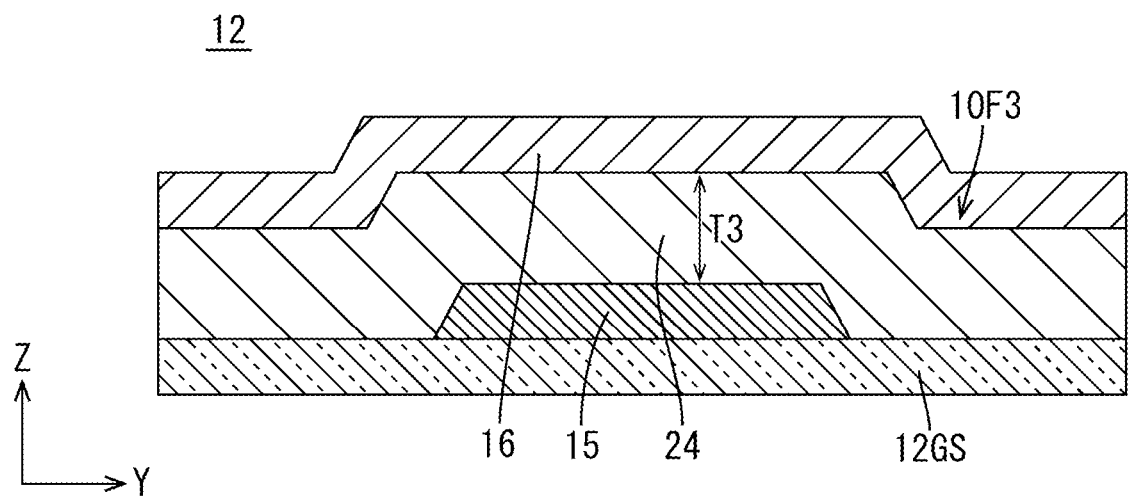
FIG. 5 is a cross-sectional view of the intersection of a gate wiring line and a source wiring line in the array substrate.

An intersection of the gate wiring line 15 and the source wiring line 16 will be described using FIG. 5. FIG. 5 is a cross-sectional view of the intersection of the gate wiring line 15 and the source wiring line 16 in the array substrate 12. A third insulating portion 24 made of the gate insulating film 10F3 is interposed between the gate wiring line 15 and the source wiring line 16 at the intersection thereof as illustrated in FIG. 5. The third insulating portion 24 is made of a different portion of the gate insulating film 10F3 from the portion of the first insulating portion 22 and the second insulating portion 23. The third insulating portion 24 has a film thickness T3 equal to the film thickness T2 of the second insulating portion 23 and greater than the film thickness T1 of the first insulating portion 22.

Figure 6:
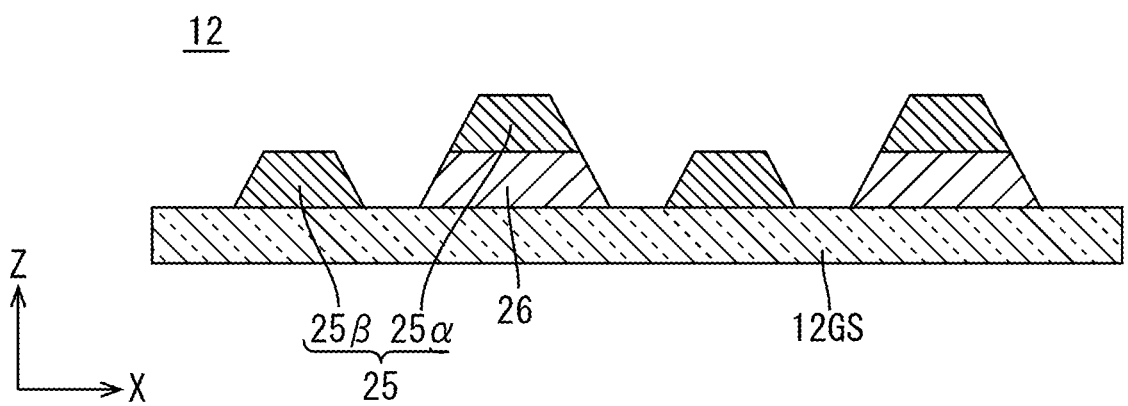
FIG. 6 is a cross-sectional view of a terminal portion in the array substrate.

The terminal portion 25 will be described using FIG. 6. FIG. 6 is a cross-sectional view of the terminal portions 25 in the array substrate 12. The terminal portions 25 are disposed in a mounting region of the array substrate 12 in which the driver 13 and the flexible substrate 14 are mounted as illustrated in FIG. 6. Each terminal portion 25 is made of a different portion of the first metal film 10F2 from the portion of the gate wiring line 15 and the gate electrode 17A. A plurality of the terminal portions 25 are arranged in a row in the X-axis direction at intervals. The plurality of terminal portions 25 may be arranged such that the arrangement intervals are equal. The second lower layer portions 26, which will be described below, are provided to overlap the lower layer side of some of the plurality of terminal portions 25. The plurality of terminal portions 25 include a first terminal portion 25a in which the second lower layer portion 26 is disposed to overlap on the lower layer side and a second terminal portion 25D in which no second lower layer portions 26 are disposed to overlap on the lower layer side. The first terminal portion 25a and the second terminal portion 25S are disposed to be adjacent to each other in a row alternately and repeatedly.

As illustrated in FIG. 6, the second lower layer portions 26 are made of a different portion of the lower layer film 10F1 from the portion of the lower layer portion 21. The second lower layer portions 26 are selectively disposed to overlap the plurality of terminal portions 25 being in a row in the X-axis direction. Specifically, the second lower layer portions 26 are disposed to overlap every other terminal portion 25. The second lower layer portions 26 are set such that the number of the second lower layer portions 26 installed is approximately half the number of the terminal portions 25 installed. Arrangement intervals of the second lower layer portions 26 in the X-axis direction (the arrangement direction of the terminal portions 25) are approximately twice the arrangement intervals of the terminal portions 25 in the X-axis direction. The second lower layer portions 26 are made of the lower layer film 10F1 having electrical conductivity. For this reason, the second lower layer portions 26 are electrically connected to the overlapping terminal portions 25. The second lower layer portions 26 are disposed in an island shape in the plate surface of the glass substrate 12GS at positions overlapping with the specific terminal portions 25, and protrude upward from the plate surface of the glass substrate 12GS. The terminal portions 25 overlapping with the second lower layer portions 26 are disposed to be separated upward from the plate surface of the glass substrate 12GS by the second lower layer portions 26. In other words, the second lower layer portions 26 are interposed between the glass substrate 12GS and the terminal portions 25 in the Z-axis direction.

The present embodiment has the structure described above, and next, a manufacturing method for the array substrate 12 will now be described. A manufacturing method for the array substrate 12 according to the present embodiment includes a first process in which the lower layer film 10F1 is formed and patterned, a second process in which the first metal film 10F2 is formed and patterned, a third process in which the gate insulating film 10F3 is formed and patterned, and a fourth process in which the semiconductor film 10F4 is formed and patterned, and a fifth process in which the second metal film 10F5 is formed and patterned. Hereinafter, each of the processes will be described using FIGS. 7A to 14B.

Figure 12A:
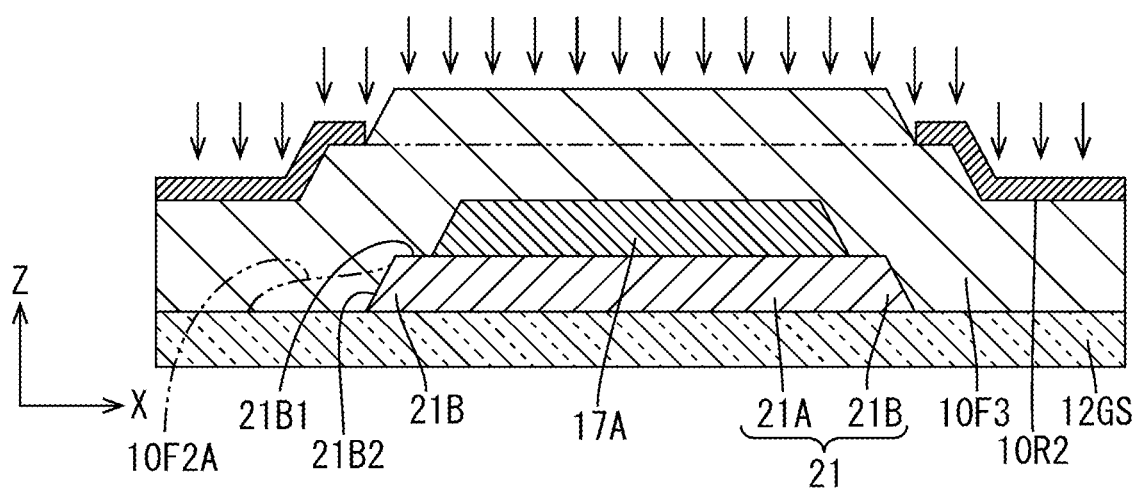
FIG. 12A is a cross-sectional view of the vicinity of the TFT illustrating a state in which the third process has been performed, the resist film has been developed, and the gate insulating film is etched.
Figure 12B:
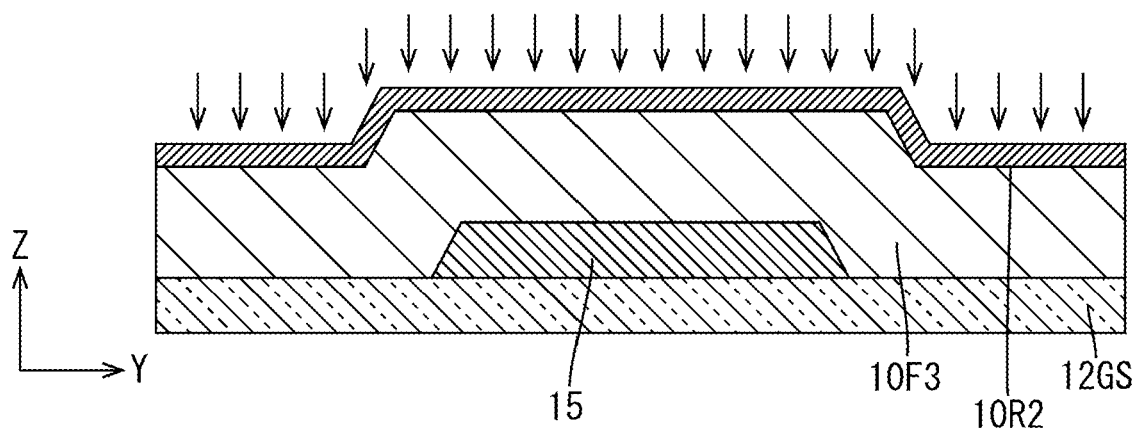
FIG. 12B is a cross-sectional view of the intersection of the gate wiring line and the source wiring line illustrating the state in which the third process has been performed, the resist film has been developed, and the gate insulating film is etched.
Figure 13B:
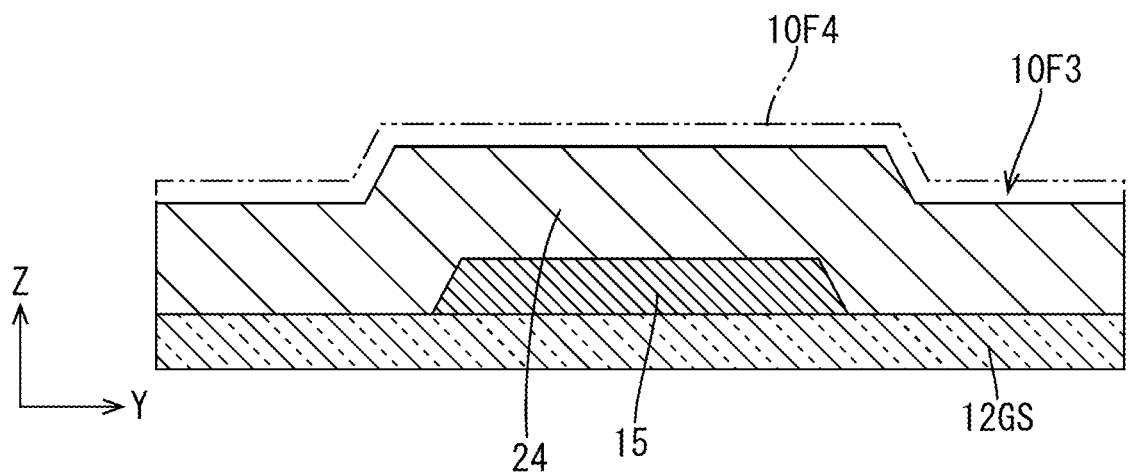
FIG. 13B is a cross-sectional view of the intersection of the gate wiring line and the source wiring line illustrating the state in which the fourth process has been performed and the semiconductor film has been patterned.
Figure 14B:
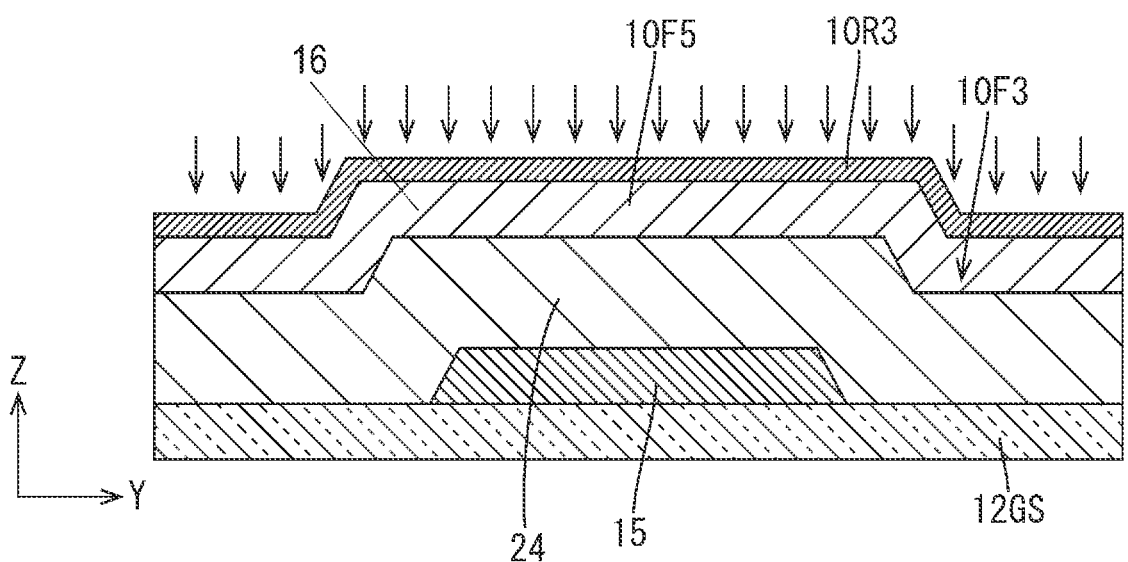
FIG. 14B is a cross-sectional view of the intersection of the gate wiring line and the source wiring line illustrating the state in which the fifth process has been performed, the second metal film and the resist film have been formed, the resist film has been exposed and developed, and the second metal film is etched.

FIGS. 7A to 14B will be described. FIGS. 7A to 7C are cross-sectional views illustrating a state in which the first process has been performed and the lower layer film 10F1 has been patterned. FIGS. 8A to 8C are cross-sectional views illustrating a state in which the second process has been performed, the first metal film 10F2 and a resist film 10R1 have been formed, and the resist film 10R1 is exposed. FIGS. 9A to 9C are cross-sectional views illustrating a state in which the second process has been performed, the resist film 10R1 has been developed, and the first metal film 10F2 is etched. FIGS. 10A to 10C are cross-sectional views illustrating a state in which the second process has been performed and the resist film 10R1 has undergone ashing. FIGS. 11A and 11B are cross-sectional views illustrating a state in which the third process has been performed, the gate insulating film 10F3 and a resist film 10R2 have been formed, and the resist film 10R2 is exposed. FIGS. 12A and 12B are cross-sectional views illustrating a state in which the third process has been performed, the resist film 10R2 has been developed, and the gate insulating film 10F3 is etched. FIGS. 13A and 13B are cross-sectional views illustrating a state in which the fourth process has been performed and the semiconductor film 10F4 is patterned. FIGS. 14A and 14B are cross-sectional views illustrating a state in which the fifth process has been performed, the second metal film 10F5 and a resist film 10R3 have been formed, the resist film 10R3 has been exposed and developed, and the second metal film 10F5 is etched. FIGS. 7A, 8A, 9A, 10A, 11A, 12A, 13A, and 14A are cross-sectional views of a vicinity of the TFT 17 in the array substrate 12. FIGS. 7B, 8B, 9B, 10B, 11B, 12B, 13B and 14B are cross-sectional views of a vicinity of the intersection of the gate wiring line 15 and the source wiring line 16 in the array substrate 12. FIGS. 7C, 8C, 9C, and 10C are cross-sectional views of a vicinity of the terminal portion 25 in the array substrate 12.

Figure 7B:
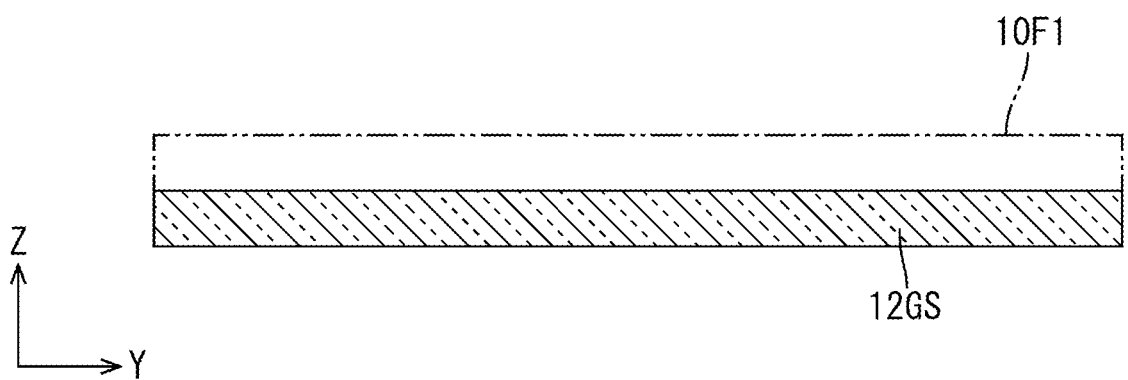
FIG. 7B is a cross-sectional view of the intersection of a gate wiring line and a source wiring line illustrating the state in which the first process has been performed and the lower layer film has been patterned.
Figure 7C:
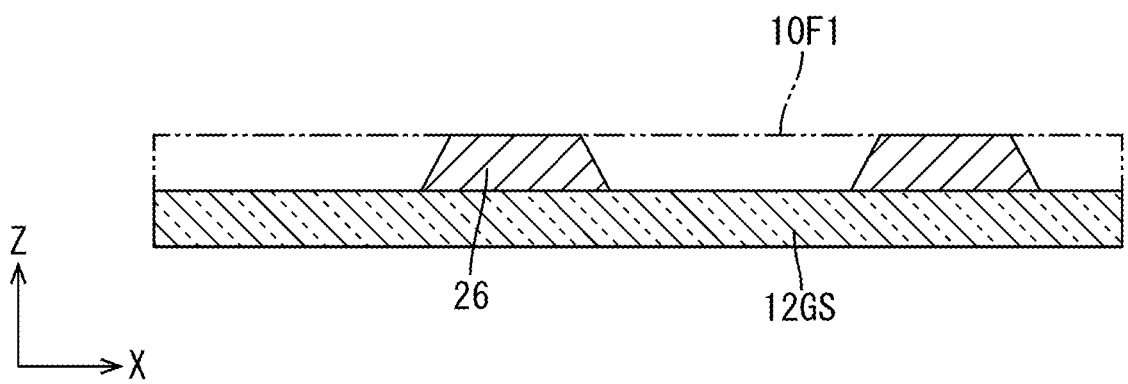
FIG. 7C is a cross-sectional view of the terminal portion illustrating the state in which the first process has been performed and the lower layer film has been patterned.

The first process will be described. In the first process, both the solid-like lower layer film 10F1 and resist film are consecutively formed on the plate surface of the glass substrate 12GS. After that, the resist film is exposed and developed using an exposure device and a photomask. The lower layer film 10F1 is etched via the developed resist film, and thus patterning of the lower layer film 10F1 is performed as illustrated in FIGS. 7A to 7C. As a result, the lower layer portion 21 is formed of a part of the lower layer film 10F1 (FIG. 7A). The second lower layer portion 26 is formed in a different portion of the lower layer film 10F1 from that of the lower layer portion 21 (FIG. 7C).

Figure 8B:
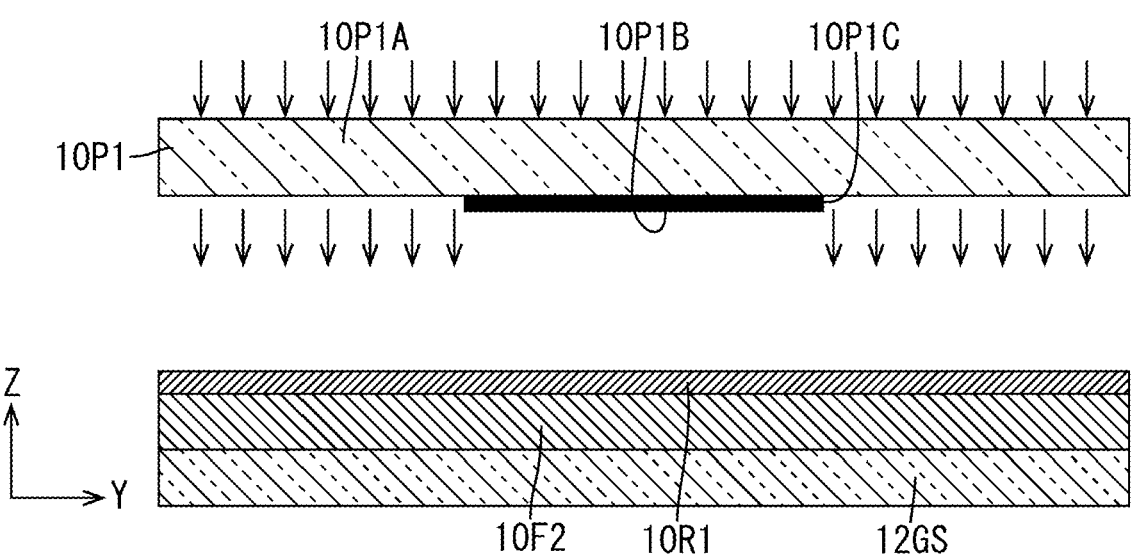
FIG. 8B is a cross-sectional view of the intersection of the gate wiring line and the source wiring line illustrating the state in which the second process has been performed, the first metal film and the resist film have been formed, and the resist film is exposed.
Figure 8C:
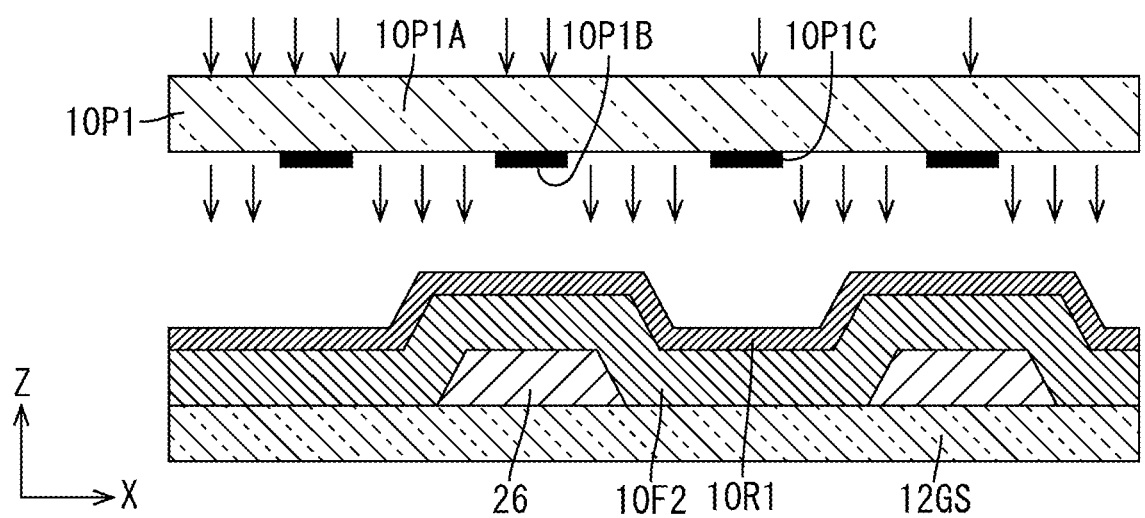
FIG. 8C is a cross-sectional view of the terminal portion illustrating the state in which the second process has been performed, the first metal film and the resist film have been formed, and the resist film is exposed.

The second process will be described. In the second process, both the solid-like first metal film 10F2 and resist film 10R1 are consecutively formed on the upper layer side of the lower layer film 10F1 as illustrated in FIGS. 8A to 8C. Thereafter, the resist film 10R1 is exposed using the exposure device and a photomask 10P1. The resist film 10R1 used in the second process is made of a positive-working photosensitive resist material. Here, the photomask 10P1 will be described. The photomask 10P1 includes a transparent base material 10P1A having sufficiently high light-transmitting properties and a light blocking film 10P1B formed on the plate surface of the base material 10P1A. The light blocking film 10P1B blocks exposure light from the light source of the exposure device, and has a partial opening 10P1C. The photomask 10P1 includes a light blocking region in which light is blocked in the formation range of the light blocking film 10P1B, and a light transmitting region through which light is transmitted in the formation range of the opening 10P1C (the non-formation range of the light blocking film 10P1B). The light blocking film 10P1B is disposed at a position at which the light blocking film 10P1B overlaps the gate wiring line 15, the gate electrode 17A, and the terminal portion 25 (see FIGS. 4 to 6) on the array substrate 12. The opening 10P1C is disposed at a position at which the opening 10P1C does not overlap the gate wiring line 15, the gate electrode 17A, and the terminal portion 25 on the array substrate 12.

In the second process, when exposure light emitted from the light source of the exposure device is radiated to the resist film 10R1 via the photomask 10P1 having the configuration as described above, the resist film 10R1 is selectively exposed to the light. When development is performed following the exposure, the exposed portion of the positive-working resist film 10R1 is removed as the rate at which the resist film is dissolved by the developer, that is, the rate of dissolution, is fast. On the other hand, non-exposed portions may remain due to a low dissolution rate. With the above process, the resist film 10R1 is patterned using the photomask 10P1.

Figure 9A:
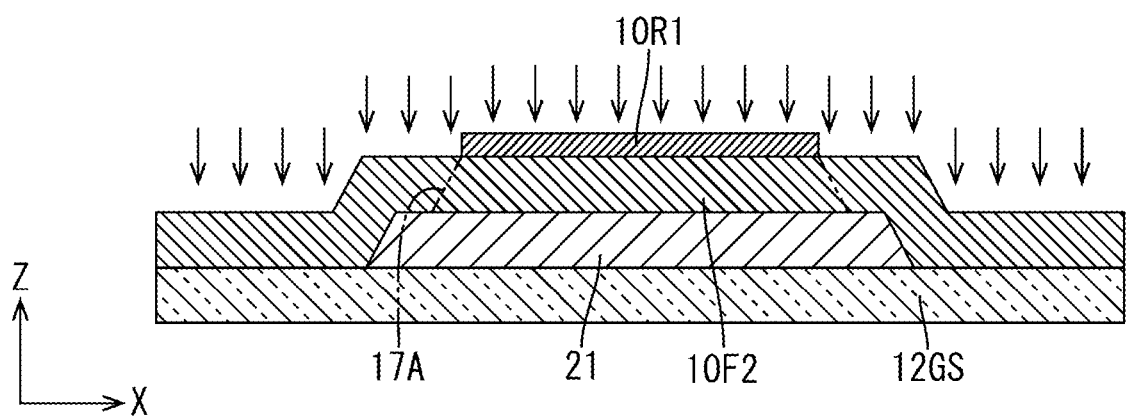
FIG. 9A is a cross-sectional view of the vicinity of the TFT illustrating a state in which the second process has been performed, the resist film has been developed, and the first metal film is etched.
Figure 9B:
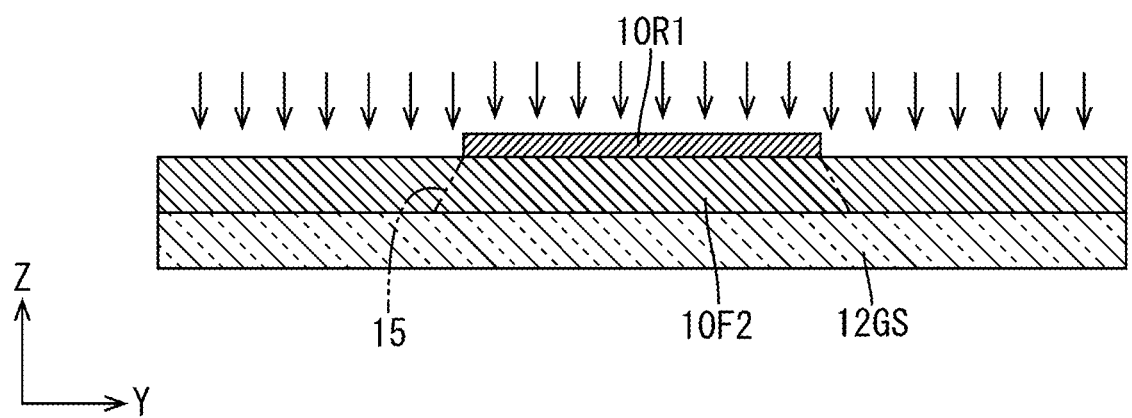
FIG. 9B is a cross-sectional view of the intersection of the gate wiring line and the source wiring line illustrating the state in which the second process has been performed, the resist film has been developed, and the first metal film is etched.
Figure 9C:
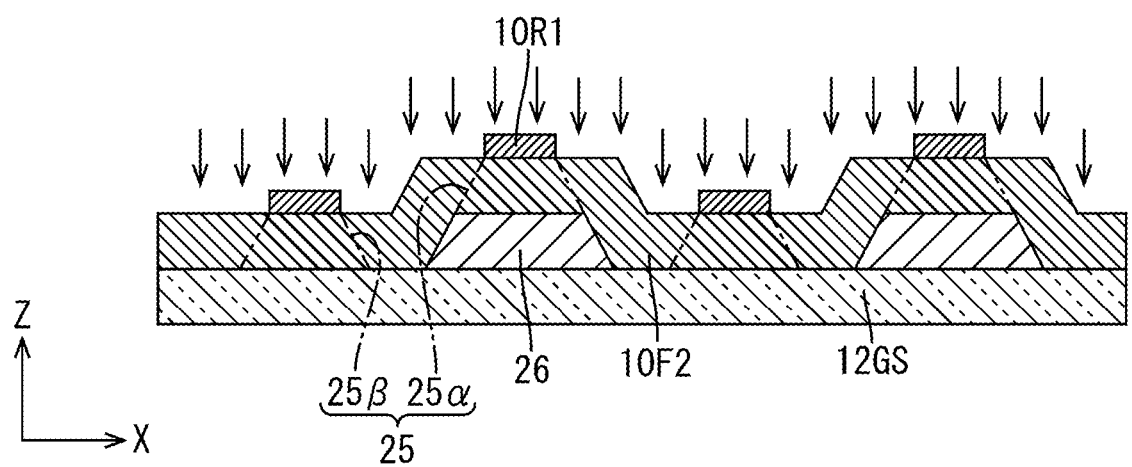
FIG. 9C is a cross-sectional view of the terminal portion illustrating the state in which the second process has been performed, the resist film has been developed, and the first metal film is etched.
Figure 10A:
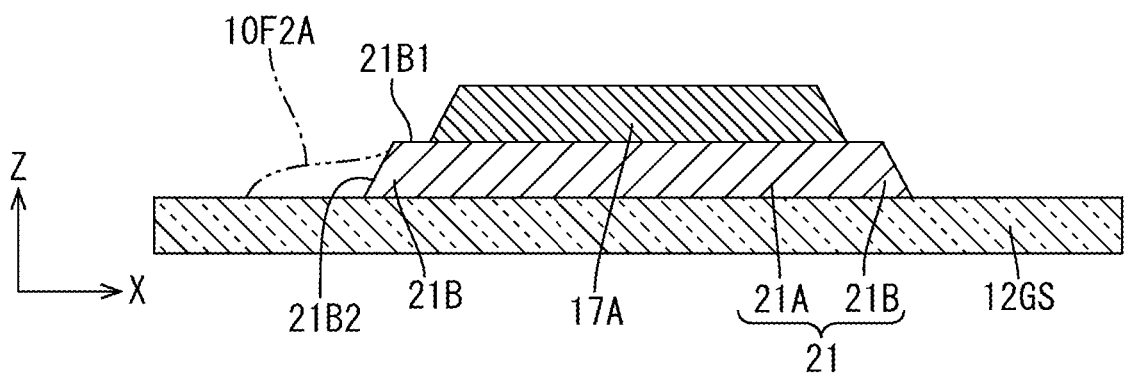
FIG. 10A is a cross-sectional view of the vicinity of the TFT illustrating a state in which the second process has been performed and the resist film has undergone ashing.
Figure 10B:
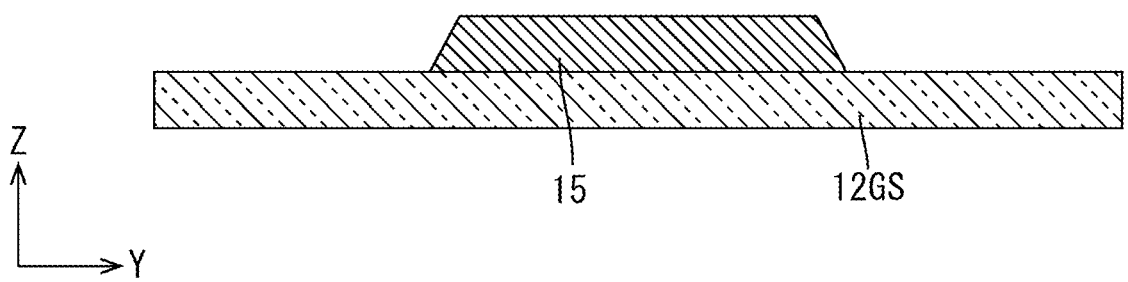
FIG. 10B is a cross-sectional view of the intersection of the gate wiring line and the source wiring line illustrating the state in which the second process has been performed and the resist film has undergone ashing.
Figure 10C:
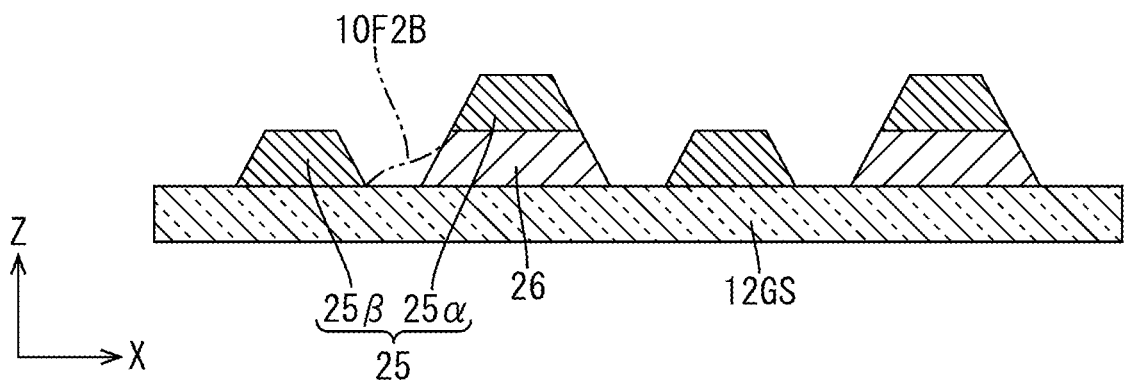
FIG. 10C is a cross-sectional view of the terminal portion illustrating the state in which the second process has been performed and the resist film has undergone ashing.

In the second process, the first metal film 10F2 is etched through the developed resist film 10R1, whereby the first metal film 10F2 is patterned as illustrated in FIGS. 9A to 9C. When etching is performed, the exposed portion of the first metal film 10F2 not covered by the resist film 10R1 is selectively removed, and the portion thereof being covered by the resist film 10R1 and thus not exposed selectively remains. As a result, the gate electrode 17A is formed of a portion of the first metal film 10F2 as illustrated in FIG. 10A. In addition, the gate wiring line 15 is formed in a different portion of the first metal film 10F2 from that of the gate electrode 17A as illustrated in FIG. 10B. Furthermore, the terminal portion 25 is formed in a different portion of the first metal film 10F2 from that of the gate wiring line 15 and the gate electrode 17A as illustrated in FIG. 10C. Further, the resist film 10R1 undergoes ashing and is removed.

By the way, there is a case in the second process in which foreign matters such as dust adheres to a portion of the first metal film 10F2 not covered by the resist film 10R1 after development is finished and before etching is performed (see FIGS. 9A to 9C). In this case, there is concern that portions of the first metal film 10F2 overlapping foreign matters may remain as film residue portions 10F2A and 10F2B without being removed by etching as illustrated in FIGS. 10A to 10C. In FIGS. 10A to 10C, the film residue portions 10F2A and 10F2B are indicated by two-dot chain lines. For example, when the film residue portion 10F2A is generated in the vicinity of the gate electrode 17A as illustrated in FIG. 10A, there is concern that the film residue portion 10F2A is electrically connected to the gate electrode 17A, and further electrically connected to the source electrode 17B or the drain electrode 17C to be formed through the fifth process. As a result, the gate electrode 17A and the source electrode 17B or the drain electrode 17C are short-circuited, which may cause a problem of a defect such as an operation failure of the TFT 17. In addition, when the film residue portion 10F2B is generated in the vicinity of the terminal portion 25 as illustrated in FIG. 10C, there is concern that the film residue portion 10F2B is electrically connected to two adjacent terminal portions 25. As a result, the two adjacent terminal portions 25 are short-circuited, which causes a problem such as a failure in transmission of signals or the like.

In that respect, the gate electrode 17A is separated from the underlayer (the glass substrate 12GS) by the lower layer portion 21 as illustrated in FIG. 10A. Thus, even if a film residue of the first metal film 10F2 that has been patterned in the second process is generated, the gate electrode 17A is disposed as far from the film residue portion 10F2A of the first metal film 10F2 produced on the underlayer as the gate electrode 17A is separated from the underlayer by the lower layer portion 21. This makes the film residue portion 10F2A of the first metal film 10F2 less likely to be electrically connected to the gate electrode 17A. Furthermore, the lower layer portion 21 includes a non-overlapping portion 21B not overlapping the gate electrode 17A. For example, when the film residue portion 10F2A of the first metal film 10F2 is present in the range from the underlayer to the gate electrode 17A, the film residue portion 10F2A has a portion riding up on the non-overlapping portion 21B. Because the non-overlapping portion 21B includes the flat surface 21B1 and the inclined surface 21B2, and thus, the coverage is not sufficient on the non-overlapping portion 21B. For this reason, a film breakage is likely to occur in the portion of the film residue portion 10F2A riding up on the non-overlapping portion 21B. This further makes the film residue portion 10F2A of the first metal film 10F2 less likely to be electrically connected to the gate electrode 17A. If the film residue portion 10F2A of the first metal film 10F2 is not electrically connected to the gate electrode 17A, the source electrode 17B or the drain electrode 17C formed through the subsequent fifth process is less likely to be short-circuited with the gate electrode 17A via the film residue portion 10F2A. Thus, a defect such as an operation failure is less likely to occur in the TFT 17, and thus the display quality of images displayed on the liquid crystal panel 10 is satisfactory.

Likewise, the first terminal portion 25a is separated from the underlayer by the second lower layer portion 26 as illustrated in FIG. 10C. Thus, even if a film residue of the first metal film 10F2 that has been patterned in the second process is generated, the first terminal portion 25a is disposed as far from the film residue portion 10F2B of the first metal film 10F2 produced on the underlayer as the first terminal portion 25a is separated from the underlayer by the second lower layer portion 26. This makes the film residue portion 10F2B of the first metal film 10F2 less likely to be electrically connected to the first terminal portion 25a. If the film residue portion 10F2B of the first metal film 10F2 is not electrically connected to the first terminal portion 25a, the second terminal portion 25 (is less likely to be short-circuited with the first terminal portion 25a via the film residue portion 10F2B. Thus, transmission of signals and the like are satisfactorily performed by each of the terminal portions 25, and thus the display quality of images displayed on the liquid crystal panel 10 is satisfactory.

Figure 11B:
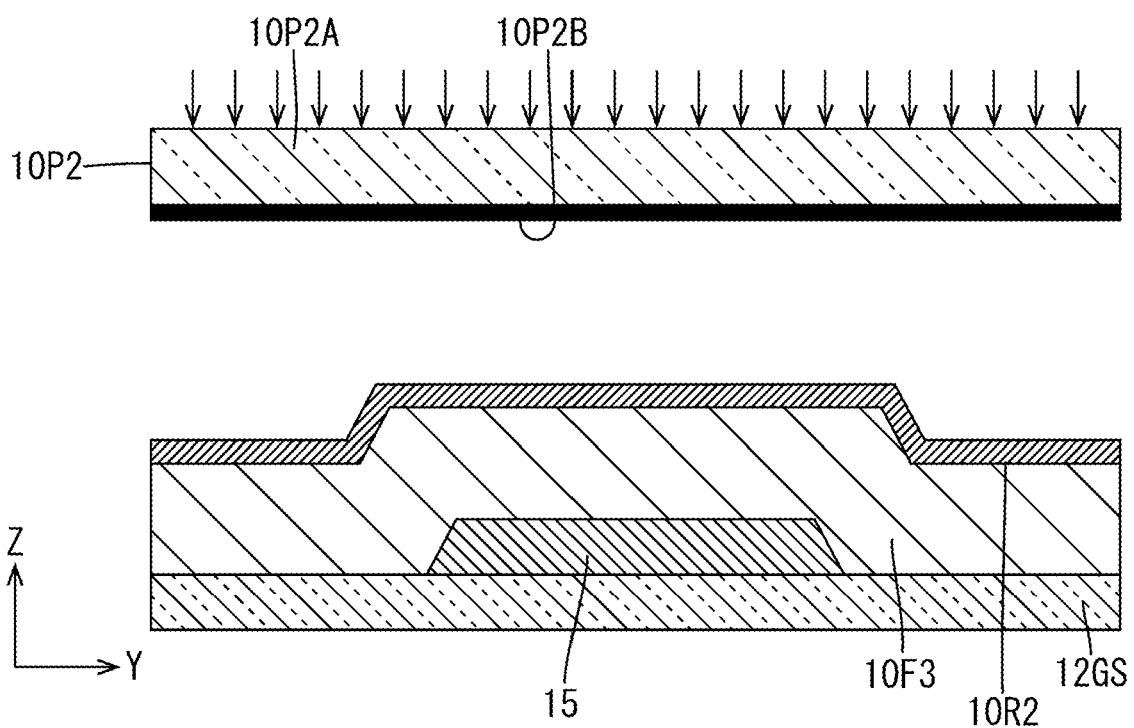
FIG. 11B is a cross-sectional view of the intersection of the gate wiring line and the source wiring line illustrating the state in which the third process has been performed, the gate insulating film and the resist film have been formed, and the resist film is exposed.

The third process will be described. In the third process, both the solid-like gate insulating film 10F3 and resist film 10R2 are consecutively formed on the upper layer side of the first metal film 10F2 as illustrated in FIGS. 11A and 11B. Thereafter, the resist film 10R2 is exposed using the exposure device and a photomask 10P2. The resist film 10R2 used in the third process is made of a positive-working photosensitive resist material as in the second process. Because the basic configuration of the photomask 10P2 used in the third process is similar to that of the photomask 10P1 used in the second process, detailed description thereof will be omitted. The photomask 10P2 used in the third process differs from the photomask 10P1 used in the second process in terms of the disposition and formation range of an opening 10P2C of a light blocking film 10P2B. The light blocking film 10P2B is disposed at a position at which the light blocking film 10P2B overlaps the second insulating portion 23 and the third insulating portion 24 (see FIGS. 5 and 6) on the array substrate 12. The opening 10P2C is disposed at a position at which the opening 10P2C overlaps the first insulating portion 22 (see FIG. 4) on the array substrate 12. Further, the photomask 10P2 has a base material 10P2A.

In the third process, when exposure light emitted from the light source of the exposure device is radiated to the resist film 10R2 via the photomask 10P2 having the configuration as described above, the positive-working resist film 10R2 is selectively exposed to the light. When development is performed following the exposure, the exposed portion of the resist film 10R2 is selectively removed, whereby the resist film 10R2 is patterned.

In the third process, as the gate insulating film 10F3 is etched via the developed resist film 10R2, the gate insulating film 10F3 is patterned as illustrated in FIGS. 12A and 12B. When etching is performed, the exposed portion of the gate insulating film 10F3 not covered by the resist film 10R2 is selectively thinned, and the portion thereof being covered by the resist film 10R2 and thus not exposed is selectively maintained at the original film thickness. At this time, by adjusting the etching speed and the etching time, the exposed portion of the gate insulating film 10F3 being not covered by the resist film 10R2 is thinned until the gate insulating film 10F3 has a target film thickness (the height indicated by the two-dot chain line of FIG. 12A, excluding the film residue portion 10F2A). As a result, the portion of the gate insulating film 10F3 overlapping the gate electrode 17A is formed as the first insulating portion 22 having the film thickness T1 as illustrated in FIG. 13A. In addition, the portion of the gate insulating film 10F3 not overlapping the gate electrode 17A but overlapping the source electrode 17B and the drain electrode 17C, which will be described later, is formed as the second insulating portion 23 having the film thickness T2. In addition, the portion of the gate insulating film 10F3 being interposed between the gate wiring line 15 and the source wiring line 16 at the intersection thereof is formed as the third insulating portion 24 having the film thickness T3 as illustrated in FIG. 13B. Among these, the first insulating portion 22 is selectively thinned by etching. Thus, the film thickness T1 of the first insulating portion 22 is smaller than each of the film thicknesses T2 and T3 of the second insulating portion 23 and the third insulating portion 24. On the other hand, the second insulating portion 23 and the third insulating portion 24 are not thinned by etching. As a result, the film thicknesses T2 and T3 of the second insulating portion 23 and the third insulating portion 24 remain the same as the original film thickness of the gate insulating film 10F3, and are greater than the film thickness T1 of the first insulating portion 22. With the above configuration, even when the film residue portion 10F2A of the first metal film 10F2 remains in the underlayer, the film residue portion 10F2A is less likely to be exposed from the second insulating portion 23 by breaking through the second insulating portion 23.

The fourth process will be described. In the fourth process, both the solid-like semiconductor film 10F4 and resist film are consecutively formed on the gate insulating film 10F3. After that, the resist film is exposed and developed using the exposure device and a photomask. As the semiconductor film 10F4 is etched via the developed resist film, the semiconductor film 10F4 is patterned as illustrated in FIGS. 13A and 13B. As a result, the channel portion 17D is formed of a portion of the semiconductor film 10F4 (FIG. 13A).

The fifth process will be described. In the fifth process, both the solid-like second metal film 10F5 and resist film 10R3 are consecutively formed on the upper layer side of the semiconductor film 10F4 as illustrated in FIGS. 14A and 14B. Thereafter, the resist film 10R3 is exposed using the exposure device and a photomask. The resist film 10R3 used in the fifth process is made of a positive-working photosensitive resist material in the same manner as in the second and third processes. Because the basic configuration of the photomask used in the fifth process is similar to that of the photomasks 10P1 and 10P2 used in the second and third processes, detailed description thereof will be omitted. The photomask used in the fifth process differs from the photomasks 10P1 and 10P2 used in the second and third processes in terms of the disposition and formation range of an opening of a light blocking film. The light blocking film is disposed at a position at which the light blocking film overlaps the source wiring line 16, the source electrode 17B, and the drain electrode 17C (see FIGS. 4 and 5) on the array substrate 12. The opening is disposed at a position at which the opening overlaps the channel portion 17D on the array substrate 12 (see FIG. 4) and does not overlap the source wiring line 16, the source electrode 17B, and the drain electrode 17C.

In the fifth process, when exposure light emitted from the light source of the exposure device is radiated to the resist film 10R3 via the photomask having the configuration as described above, the positive-working resist film 10R3 is selectively exposed to the light. When development is performed following the exposure, the exposed portion of the resist film 10R3 is selectively removed, whereby the resist film 10R3 is patterned as illustrated in FIGS. 14A and 14B.

In the fifth process, the second metal film 10F5 is etched through the developed resist film 10R3, whereby the second metal film 10F5 is patterned as illustrated in FIGS. 14A and 14B. When etching is performed, the exposed portion of the second metal film 10F5 not covered by the resist film 10R3 is selectively removed, and the portion thereof being covered by the resist film 10R3 and thus not exposed is selectively maintained at the original film thickness. As a result, the source electrode 17B is formed of a portion of the second metal film 10F5 as illustrated in FIG. 14A. In addition, the drain electrode 17C is formed in a different portion of the second metal film 10F5 from the source electrode 17B. In addition, the source wiring line 16 is formed in a different portion of the second metal film 10F5 from that of the source electrode 17B and the drain electrode 17C as illustrated in FIG. 14B.

The second insulating portion 23 disposed to overlap the source electrode 17B and the drain electrode 17C on the lower layer side has the film thickness T2 greater than the film thickness T1 of the first insulating portion 22 as illustrated in FIG. 14A. For this reason, even if the film residue portion 10F2A of the first metal film 10F2 remains in the underlayer of the second insulating portion 23, the film residue portion 10F2A is less likely to break through the second insulating portion 23 and to be electrically connected to the source electrode 17B and the drain electrode 17C. Accordingly, the source electrode 17B or the drain electrode 17C is less likely to be short-circuited with the gate electrode 17A via the film residue portion 10F2A. Thus, a defect such as an operation failure is less likely to occur in the TFT 17, and thus the display quality of images displayed on the liquid crystal panel 10 is satisfactory.

As described above, the array substrate (a thin film transistor substrate) 12 according to the present embodiment includes a glass substrate (a substrate) 12GS and a bottom gate-type TFT (a thin film transistor) 17 including the gate electrode 17A, the channel portion 17D, the source electrode 17B, and the drain electrode 17C formed on the glass substrate 12GS, in which the gate insulating film 10F3 disposed between the gate electrode 17A and the channel portion 17D is provided, the gate electrode 17A is made of the first metal film (a first conductive film) 10F2 disposed on the lower layer side of the gate insulating film 10F3, the channel portion 17D is made of the semiconductor film 10F4 disposed on the upper layer side of the gate insulating film 10F3 and disposed to overlap the gate electrode 17A, the source electrode 17B is made of the second metal film (a second conductive film) 10F5 disposed on the upper layer side of the semiconductor film 10F4 and disposed to have at least a portion overlapping the channel portion 17D, the drain electrode 17C is made of a different portion of the second metal film 10F5 from that of the source electrode 17B and disposed to have at least a portion overlapping the channel portion 17D at a position spaced from the source electrode 17B, and the gate insulating film 10F3 includes the first insulating portion 22 overlapping the gate electrode 17A, and the second insulating portion 23 that is disposed not to overlap the gate electrode 17A but to overlap the source electrode 17B and the drain electrode 17C, and has a film thickness greater than that of the first insulating portion 22, and the lower layer portion 21 that is made of the lower layer film 10F1 disposed on the lower layer side of the first metal film 10F2 and has at least a portion overlapping the gate electrode 17A is provided.

The gate electrode 17A is separated from the underlayer (the glass substrate 12GS) by the lower layer portion 21. Thus, even if a film residue of the first metal film 10F2 is generated when the first metal film 10F2 is patterned to form the gate electrode 17A in the manufacturing process, the gate electrode 17A is disposed as far from the film residue portion 10F2A of the first metal film 10F2 produced on the underlayer as the gate electrode 17A is separated from the underlayer by the lower layer portion 21. This makes the film residue portion 10F2A of the first metal film 10F2 less likely to be electrically connected to the gate electrode 17A.

On the other hand, the second insulating portion 23 of the gate insulating film 10F3 not overlapping the gate electrode 17A but overlapping the source electrode 17B and the drain electrode 17C is interposed between the source electrode 17B as well as the drain electrode 17C and the under layer, and thus has a film thickness greater than that of the first insulating portion 22 overlapping the gate electrode 17A. This makes the film residue portion 10F2A of the first metal film 10F2 produced in the underlayer less likely to break through the second insulating portion 23 and to be electrically connected to the source electrode 17B or the drain electrode 17C.

With the above configuration, the gate electrode 17A and the source electrode 17B or the drain electrode 17C are less likely to be short-circuited. This makes it difficult to cause a defect such as an operation failure in the TFT 17. Furthermore, because the first insulating portion 22 interposed between the gate electrode 17A and the channel portion 17D has the film thickness smaller than that of the second insulating portion 23, the first insulating portion 22 is suitable for lowering the threshold voltage of the TFT 17.

In addition, the lower layer portion 21 includes the overlapping portion 21A overlapping the gate electrode 17A, and the non-overlapping portions 21B not overlapping the gate electrode 17A. With this configuration, the film residue of the first metal film 10F2 generated when forming the gate electrode 17A may be present in the range from the underlayer to the gate electrode 17A. In this case, the film residue portion 10F2A of the first metal film 10F2 has a portion riding up on the non-overlapping portion 21B of the lower layer portion 21. Because coverage is not sufficient on the non-overlapping portion 21B, a film breakage is likely to occur in the film residue portion 10F2A of the first metal film 10F2. This makes the film residue portion 10F2A of the first metal film 10F2 less likely to be electrically connected to the gate electrode 17A.

In addition, the gate wiring line (a first wiring line) 15 that is made of a different portion of the first metal film 10F2 from that of the gate electrode 17A, the source wiring line (a second wiring line) 16 that is made of a different portion of the second metal film 10F5 from that of the source electrode 17B and the drain electrode 17C and intersects with the gate wiring line 15, and the third insulating portion 24 that is made of a different portion of the gate insulating film 10F3 from that of the first insulating portion 22 and the second insulating portion 23, is interposed between the gate wiring line 15 and the source wiring line 16 at the intersection thereof, and has the same film thickness as the second insulating portion 23 are provided. With this configuration, the third insulating portion 24 interposed between the gate wiring line 15 and the source wiring line 16 at the intersection thereof has the same film thickness as the second insulating portion 23, and a film thickness greater than that of the first insulating portion 22. As a result, parasitic capacitance that can occur between the gate wiring line 15 and the source wiring line 16 intersecting each other can be reduced. Furthermore, this configuration improves the performance of the withstand voltage between the gate wiring lines 15 and the source wiring lines 16, and thus is favorable for preventing electro-static discharge (ESD).

In addition, a plurality of the terminal portions 25 that are made of a different portion of the first metal film 10F2 from that of the gate electrode 17A and are arranged at intervals, and the second lower layer portions 26 that are made of a different portion of the lower layer film 10F1 from that of the lower layer portion 21 and disposed to have at least a portion overlapping at least one terminal portion 25 are provided.

The terminal portions 25 are separated from the underlayer by the second lower layer portions 26. Thus, even if a film residue of the first metal film 10F2 is generated when the first metal film 10F2 is patterned to form the gate electrode 17A and the plurality of terminal portions 25 in the manufacturing process, the terminal portions 25 are disposed as far from the film residue portion 10F2B of the first metal film 10F2 produced on the underlayer as the terminal portions 25 are separated from the underlayer by the second lower layer portions 26. This makes the film residue portion 10F2B of the first metal film 10F2 less likely to be electrically connected to the terminal portions 25 overlapping the second lower layer portions 26. With the above configuration, the terminal portions 25 overlapping the second lower layer portions 26 and the terminal portions 25 adjacent thereto are less likely to be short-circuited.

In addition, the gate wiring lines 15 made of a different portion of the first metal film 10F2 from that of the gate electrode 17A and connected to the gate electrode 17A is provided, and the lower layer portion 21 is made of a conductive material. With this configuration, the lower layer portion 21 is electrically connected to the overlapping gate electrode 17A. As a result, wiring resistance of the gate wiring lines 15 connected to the gate electrode 17A can be reduced.

In addition, the liquid crystal panel (display device) 10 according to the present embodiment includes the array substrate 12 described above and the counter substrate 11 arranged to face the array substrate 12. According to the liquid crystal panel 10, no defects are likely to occur in the TFT 17, and thus the display quality is improved.

In addition, the manufacturing method for the array substrate 12 according to the present embodiment includes: forming the lower layer film 10F1 on the glass substrate 12GS and patterning the lower layer film 10F1 to provide the lower layer portion 21; forming the first metal film 10F2 on the upper layer side of the lower layer film 10F1 and patterning the first metal film 10F2 to provide the gate electrode 17A overlapping at least a portion of the lower layer portion 21 and constituting the bottom gate-type TFT 17; forming the gate insulating film 10F3 on the upper layer side of the first metal film 10F2 and patterning the portion of the gate insulating film 10F3 overlapping the gate electrode 17A to be selectively etched to provide the first insulating portion 22 overlapping the gate electrode 17A and the second insulating portion 23 disposed not to overlap the gate electrode 17A and having a film thickness greater than that of the first insulating portion 22; forming the semiconductor film 10F4 on the upper layer side of the gate insulating film 10F3 and patterning the semiconductor film 10F4 to provide the channel portion 17D disposed to overlap the gate electrode 17A and constituting the TFT 17; and forming the second metal film 10F5 on the upper layer side of the semiconductor film 10F4 and patterning the second metal film 10F5 to provide the source electrode 17B disposed to have at least a portion overlapping the channel portion 17D and constituting the TFT 17 and the drain electrode 17C disposed to have at least a portion overlapping the channel portion 17D at a position spaced from the source electrode 17B and constituting the TFT 17.

When the first metal film 10F2 is formed and patterned, the gate electrode 17A constituting the bottom gate-type TFT 17 is provided to overlap at least a portion of the lower layer portion 21. The gate electrode 17A is separated from the underlayer (the glass substrate 12GS) by the lower layer portion 21. Thus, even if a film residue of the first metal film 10F2 is generated when the first metal film 10F2 is patterned, the gate electrode 17A is disposed as far from the film residue portion 10F2A of the first metal film 10F2 produced on the underlayer as the gate electrode 17A is separated from the underlayer by the lower layer portion 21. This makes the film residue portion 10F2A of the first metal film 10F2 less likely to be electrically connected to the gate electrode 17A. On the other hand, when the gate insulating film 10F3 is formed and patterned, the first insulating portion 22 overlapping the gate electrode 17A and the second insulating portion 23 not overlapping the gate electrode 17A are provided. After that, when the semiconductor film 10F4 and the second metal film 10F5 are sequentially formed and patterned, the channel portion 17D, the source electrode 17B, and the drain electrode 17C constituting the TFT 17 are provided. The source electrode 17B and the drain electrode 17C are disposed to overlap the second insulating portions 23 having a greater film thickness than the first insulating portions 22. This makes the film residue portion 10F2A of the first metal film 10F2 produced in the underlayer less likely to break through the second insulating portion 23 and to be electrically connected to the source electrode 17B or the drain electrode 17C.

With the above configuration, the gate electrode 17A and the source electrode 17B or the drain electrode 17C are less likely to be short-circuited. This makes it difficult to cause a defect such as an operation failure in the TFT 17. Furthermore, because the first insulating portion 22 interposed between the gate electrode 17A and the channel portion 17D has the film thickness smaller than that of the second insulating portion 23, the first insulating portion 22 is suitable for lowering the threshold voltage of the TFT 17.

Second Embodiment

A second embodiment will be described with reference to FIGS. 15 to 19. In the second embodiment, a configuration of a gate insulating film 110F3 is changed. Further, repetitive descriptions of structures, actions, and effects similar to those of the first embodiment described above will be omitted.

Figure 15:
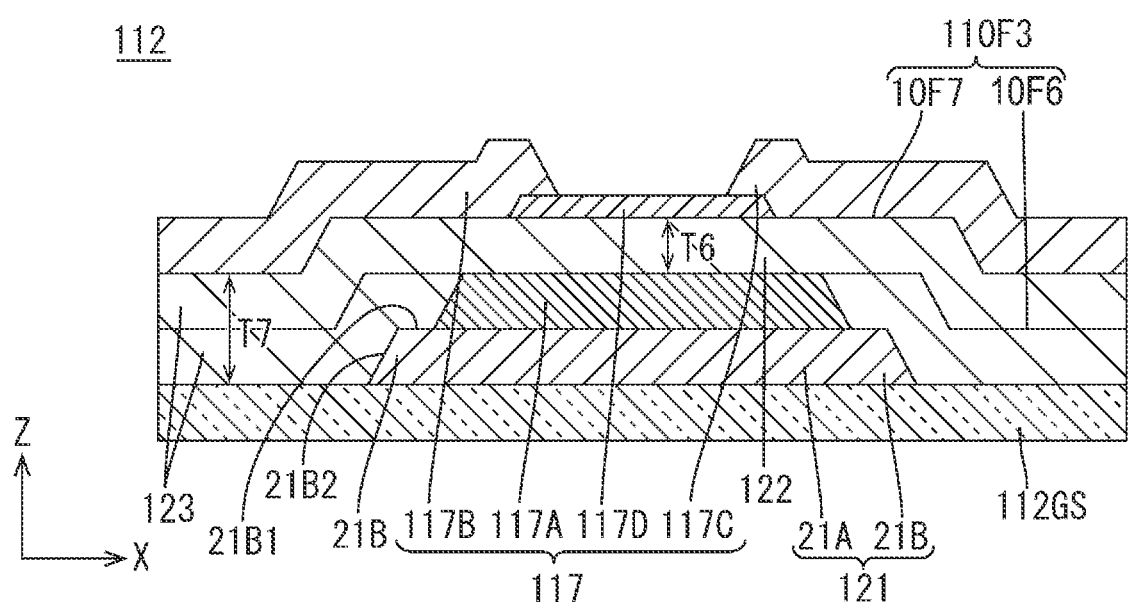
FIG. 15 is a cross-sectional view of a vicinity of a TFT in an array substrate according to a second embodiment.

FIG. 15 is a cross-sectional view of a vicinity of a TFT 117 in an array substrate 112. The gate insulating film 110F3 according to the present embodiment includes a first gate insulating film 10F6 disposed on an upper layer side of the first metal film and a second gate insulating film 10F7 disposed on an upper layer side of the first gate insulating film 10F6 as illustrated in FIG. 15. The first gate insulating film 10F6 is made of an inorganic material such as silicon nitride (SiNx) or silicon oxide ($SiO_2$). The second gate insulating film 10F7 is made of the same material as the first gate insulating film 10F6. The second gate insulating film 10F7 has a film thickness equal to that of the first gate insulating film 10F6. Thus, the film thickness of the gate insulating film 110F3 is the sum of the film thickness of the first gate insulating film 10F6 and the film thickness of the second gate insulating film 10F7. In addition, the film thickness of the gate insulating film 110F3 is approximately twice the film thickness of the first gate insulating film 10F6 or the film thickness of the second gate insulating film 10F7. With this configuration, the first gate insulating film 10F6 and the second gate insulating film 10F7 can be formed under the same conditions during manufacturing. As a result, the production facility of the first gate insulating film 10F6 and the second gate insulating film 10F7 can be shared, and the productivity or the like will be improved.

A first insulating portion 122 includes the second gate insulating film 10F7 without including the first gate insulating film 10F6. That is, the first insulating portion 122 is formed only of the second gate insulating film 10F7. For this reason, a film thickness T6 of the first insulating portion 122 is equal to the film thickness of the second gate insulating film 10F7. A second insulating portion 123 includes the first gate insulating film 10F6 and the second gate insulating film 10F7. Thus, a film thickness T7 of the second insulating portion 123 is the sum of the film thickness of the first gate insulating film 10F6 and the film thickness of the second gate insulating film 10F7. Here, in the first embodiment described above, the gate insulating film 10F3 is set to have a single layer structure, and the formed gate insulating film 10F3 is selectively etched in the manufacturing process to adjust the film thickness T1 of the first insulating portion 22 to be smaller than the film thickness T2 of the second insulating portion 23 (see FIG. 4). In comparison, in the present embodiment, the film thickness T6 of the first insulating portion 122 is equal to the film thickness of the second gate insulating film 10F7, and thus the accuracy of the film thickness of the first insulating portion 122 is high. In addition, the accuracy of the film thickness of the first insulating portion 122 is increased, even if a comparison with a case in which the first gate insulating film 10F6 is selectively etched, and the first gate insulating film 10F6 is configured to be included in the first insulating portion 122 in the manufacturing process is made.

Next, a manufacturing method for the array substrate 112 according to the present embodiment will be described. The manufacturing method for the array substrate 112 differs from that of the first embodiment in that the third process among the first to fifth processes described in the first embodiment above includes a pre-process and a post-process. The pre-process and the post-process of the third process will be described using FIGS. 16 to 19. Note that, because the first, second, fourth, and fifth processes are similar to those of the first embodiment described above, overlapping description will be omitted below.

Figure 16:
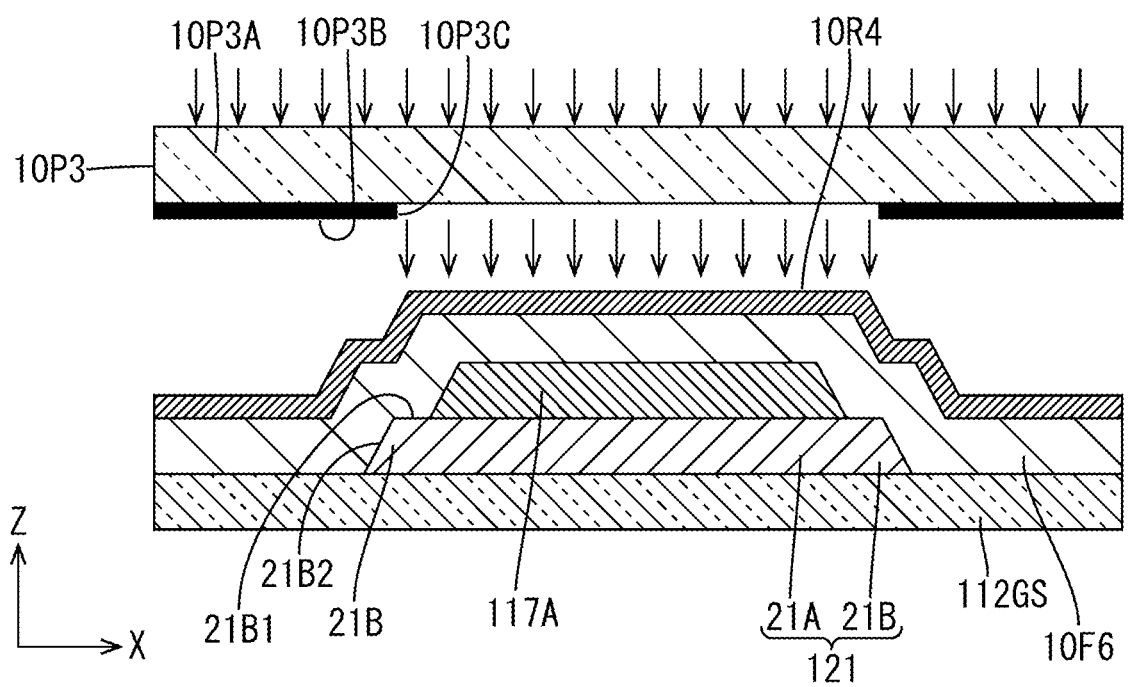
FIG. 16 is a cross-sectional view of the vicinity of the TFT illustrating a state in which pre-process of the third process has been performed to form a first gate insulating film and a resist film, and the resist film is exposed.
Figure 17:
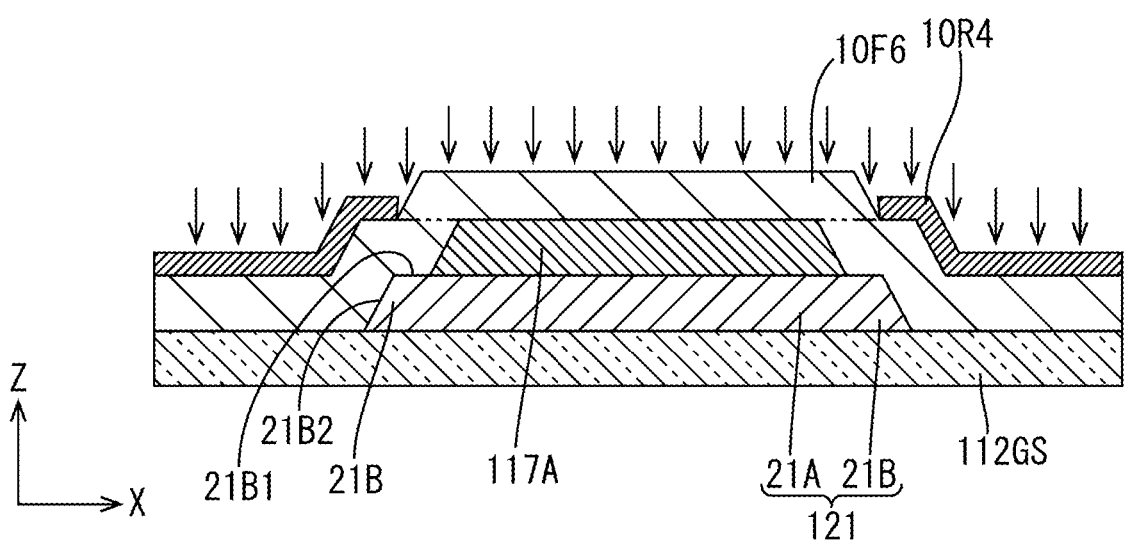
FIG. 17 is a cross-sectional view of the vicinity of the TFT illustrating a state in which the pre-process of the third process has been performed to develop the resist film, and the first gate insulating film is etched.
Figure 18:
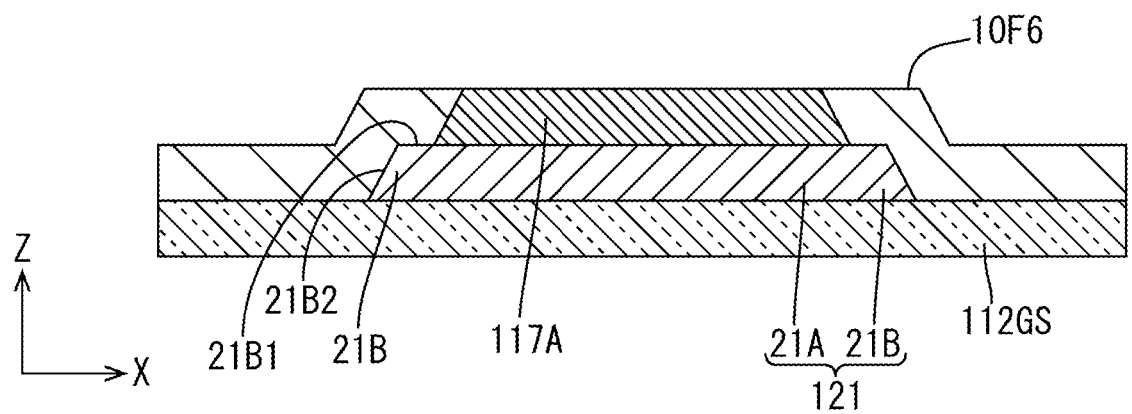
FIG. 18 is a cross-sectional view of the vicinity of the TFT illustrating a state in which the pre-process of the third process has been performed and the first gate insulating film has been etched.
Figure 19:
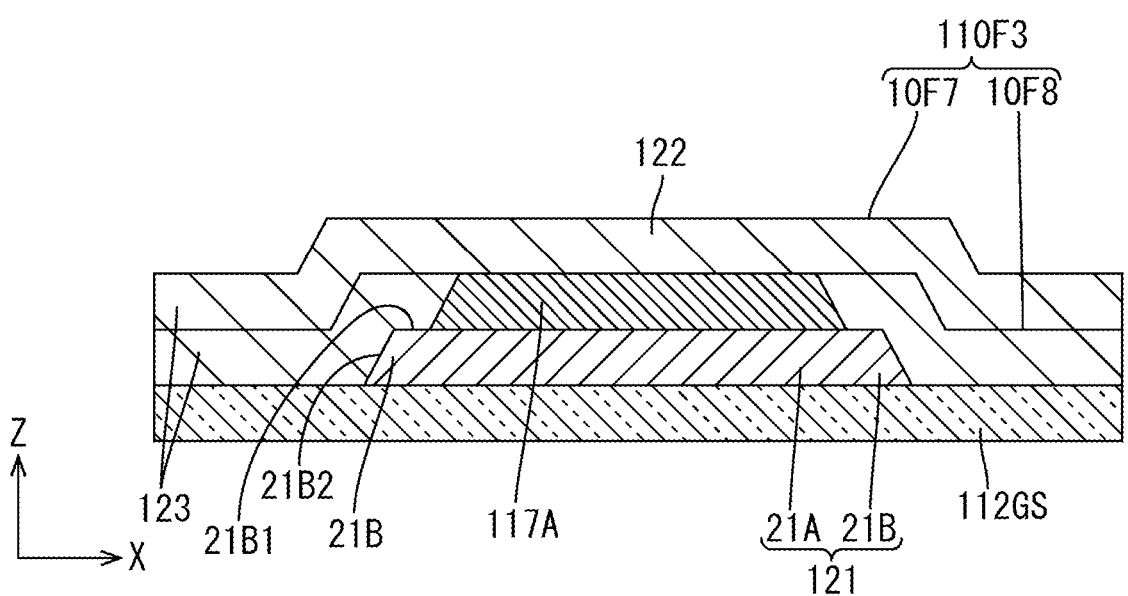
FIG. 19 is a cross-sectional view of the vicinity of the TFT illustrating a state in which the post-process of the third process has been performed and a second gate insulating film has been formed.

FIGS. 16 to 19 will be described. FIG. 16 is a cross-sectional view of a vicinity of the TFT 117 illustrating a state in which the pre-process of the third process has been performed, the first gate insulating film 10F6 and a resist film 10R4 have been formed, and the resist film 10R4 is exposed. FIG. 17 is a cross-sectional view of the vicinity of the TFT 117 illustrating a state in which the pre-process of the third process has been performed to develop the resist film 10R4, and the first gate insulating film 10F6 is etched. FIG. 18 is a cross-sectional view of the vicinity of the TFT 117 illustrating a state in which the pre-process of the third process has been performed and the first gate insulating film 10F6 has been etched. FIG. 19 is a cross-sectional view of a vicinity of the TFT 117 illustrating a state in which the post-process of the third process has been performed and the second gate insulating film 10F7 has been formed.

The pre-process of the third process will be described. In the pre-process, both the solid-like first gate insulating film 10F6 and resist film 10R4 are consecutively formed on the upper layer side of the first metal film as illustrated in FIG. 16. Thereafter, the resist film 10R4 is exposed using an exposure device and a photomask 10P3. The resist film 10R4 used in the pre-process is made of a positive-working photosensitive resist material as in the second process. Because the basic configuration of the photomask 10P3 used in the pre-process is similar to that of the photomask 10P1 (see FIG. 8A, etc.) used in the second process, detailed description thereof will be omitted. The photomask 10P3 used in the pre-process is the same as the photomask 10P2 (see FIG. 11A, etc.) used in the third process of the first embodiment. That is, a light blocking film 10P3B provided in the photomask 10P3 is disposed at a position at which the light blocking film 10P3B overlaps the second insulating portion 123 (see FIG. 15) and a third insulating portion on the array substrate 112, respectively. An opening 10P3C is disposed at a position at which the opening 10P3C overlaps the first insulating portion 122 (see FIG. 15) on the array substrate 112. Further, the photomask 10P3 has a base material 10P3A.

In the pre-process, when exposure light emitted from the light source of the exposure device is radiated to the resist film 10R4 via the photomask 10P3 having the configuration as described above, the positive-working resist film 10R4 is selectively exposed to the light. When development is performed following the exposure, the exposed portion of the resist film 10R4 is selectively removed, whereby the resist film 10R4 is patterned as illustrated in FIG. 17.

In the pre-process, as the first gate insulating film 10F6 is etched via the developed resist film 10R4, the first gate insulating film 10F6 is patterned as illustrated in FIG. 17. When etching is performed, the exposed portion of the first gate insulating film 10F6 not covered by the resist film 10R4 is selectively removed, and the portion thereof being covered by the resist film 10R4 and thus not exposed is selectively maintained at the original film thickness. At this time, the etching is performed until the exposed portion of the first gate insulating film 10F6 being not covered by the resist film 10R4 is removed and a gate electrode 117A is exposed. As a result, the portion of the first gate insulating film 10F6 overlapping the gate electrode 117A is removed, and an opening is formed as illustrated in FIG. 18. In this state, the gate electrode 117A is exposed. On the other hand, the portion of the first gate insulating film 10F6 not overlapping the gate electrode 117A remains with the original film thickness.

The post-process of the third process will be described. In the post-process performed following the pre-process, the solid-like second gate insulating film 10F7 is formed on the first gate insulating film 10F6 as illustrated in FIG. 19. The second gate insulating film 10F7 is not subject to the processing (etching) performed on the first gate insulating film 10F6. For this reason, the first insulating portion 122 overlapping the gate electrode 117A and the second insulating portion 123 not overlapping the gate electrode 117A are provided. The first insulating portion 122 is made of only the second gate insulating film 10F7 without including the first gate insulating film 10F6, and the film thickness T6 of the first insulating portion 122 is equal to the film thickness of the first gate insulating film 10F6. The second insulating portion 123 is made of the first gate insulating film 10F6 and the second gate insulating film 10F7, and the film thickness T7 of the second insulating portion 123 is equal to the sum of the film thicknesses of the first gate insulating film 10F6 and the second gate insulating film 10F7.

The array substrate 112 according to the present embodiment described above includes the gate insulating film 110F3 having the first gate insulating film 10F6 disposed on the upper layer side of the first metal film and the second gate insulating film 10F7 disposed on the upper layer side of the first gate insulating film 10F6, the first insulating portion 122 including the second gate insulating film 10F7 without including the first gate insulating film 10F6, and the second insulating portion 123 including the first gate insulating film 10F6 and the second gate insulating film 10F7. In this configuration, the first insulating portion 122 is formed of only the second gate insulating film 10F7. For this reason, the film thickness of the first insulating portion 122 is equal to the film thickness of the second gate insulating film 10F7. Here, the accuracy of the film thickness of the first insulating portion 122 is increased, even if a comparison with the case in which the gate insulating film 10F3 is set to have a single layer structure, and the formed gate insulating film 10F3 is selectively etched in the manufacturing process to adjust the film thickness of the first insulating portion 22 to be smaller than the film thickness of the second insulating portion 23 is made. In addition, the accuracy of the film thickness of the first insulating portion 122 is increased, even if a comparison with a case in which the first gate insulating film 10F6 is selectively etched, and the first gate insulating film 10F6 is configured to be included in the first insulating portion 122 in the manufacturing process is made.

In addition, the manufacturing method for the array substrate 112 according to the present embodiment includes: forming a lower layer film on a glass substrate 112GS and patterning the lower layer film to provide a lower layer portion 121; forming a first metal film on the upper layer side of the lower layer film and patterning the first metal film to provide the gate electrode 117A overlapping at least a portion of the lower layer portion 121 and constituting a bottom gate-type TFT 117; forming the first gate insulating film 10F6 on the upper layer side of the first metal film and patterning the portion of the first gate insulating film 10F6 overlapping the gate electrode 117A to be selectively etched, and then forming the second gate insulating film 10F7 on the upper layer side of the first gate insulating film 10F6 to provide the first insulating portion 122 overlapping the gate electrode 117A and at least including the second gate insulating film 10F7 and the second insulating portion 123 disposed not to overlap the gate electrode 117A, including the first gate insulating film 10F6 and the second gate insulating film 10F7, and having a film thickness greater than that of the first insulating portion 122; forming a semiconductor film on the upper layer side of the second gate insulating film 10F7 and patterning the semiconductor film to provide a channel portion 117D disposed to overlap the gate electrode 117A and constituting the TFT 117; and forming a second metal film on the upper layer side of the semiconductor film and patterning the second metal film to provide a source electrode 117B disposed to have at least a portion overlapping the channel portion 117D and constituting the TFT 117 and a drain electrode 117C disposed to have at least a portion overlapping the channel portion 117D at a position spaced from the source electrode 117B and constituting the TFT 117.

When the first metal film is formed and patterned, the gate electrode 117A constituting the bottom gate-type TFT 117 is provided to overlap at least a portion of the lower layer portion 121. The gate electrode 117A is separated from the underlayer (the glass substrate 112GS) by the lower layer portion 121. Thus, even if a film residue of the first metal film is generated when the first metal film is patterned, the gate electrode 117A is disposed as far from the film residue portion of the first metal film produced on the underlayer as the gate electrode 117A is separated from the underlayer by the lower layer portion 121. As a result, the film residue portion of the first metal film is less likely to be electrically connected to the gate electrode 117A. On the other hand, when the first gate insulating film 10F6 is formed and patterned to selectively etch the portion of the first gate insulating film 10F6 overlapping the gate electrode 117A and then the second gate insulating film 10F7 is formed, the first insulating portion 122 overlapping the gate electrode 117A and the second insulating portion 123 not overlapping the gate electrode 117A are provided. The first insulating portion 122 includes at least the second gate insulating film 10F7. The second insulating portion 123 includes the first gate insulating film 10F6 and the second gate insulating film 10F7. After that, when the semiconductor film and the second metal film are sequentially formed and patterned, the channel portion 117D, the source electrode 117B, and the drain electrode 117C constituting the TFT 117 are provided. The source electrode 117B and the drain electrode 117C are disposed to overlap the second insulating portion 123 having a greater film thickness than the first insulating portion 122. This makes the film residue portion of the first metal film produced in the underlayer break through the second insulating portion 123 and be less likely electrically connected to the source electrode 117B or the drain electrode 117C.

With the above configuration, the gate electrode 117A and the source electrode 117B or the drain electrode 117C are less likely to be short-circuited. This makes it difficult to cause a defect such as an operation failure in the TFT 117. Furthermore, because the first insulating portion 122 interposed between the gate electrode 117A and the channel portion 117D has the film thickness smaller than that of the second insulating portion 123, the first insulating portion 122 is suitable for lowering a threshold voltage of the TFT 117.

In addition, the portion of the first gate insulating film 10F6 overlapping the gate electrode 117A is removed when the first gate insulating film 10F6 is patterned. With this operation, the first insulating portion 122 includes the second gate insulating film 10F7 without including the first gate insulating film 10F6. For this reason, the film thickness of the first insulating portion 122 is equal to the film thickness of the second gate insulating film 10F7. Thus, the accuracy of the film thickness of the first insulating portion 122 is increased, if a comparison with a case in which the first gate insulating film 10F6 is selectively etched, and the first gate insulating film 10F6 is included in the first insulating portion 122 in the manufacturing process is made.

Third Embodiment

A third embodiment will be described with reference to FIGS. 20 to 24. In the third embodiment, a configuration of a first insulating portion 222, a film thickness of a first gate insulating film 210F6, and the like are changed from those of the above-described second embodiment. Further, repetitive descriptions of structures, actions, and effects similar to those of the first embodiment described above will be omitted.

Figure 20:
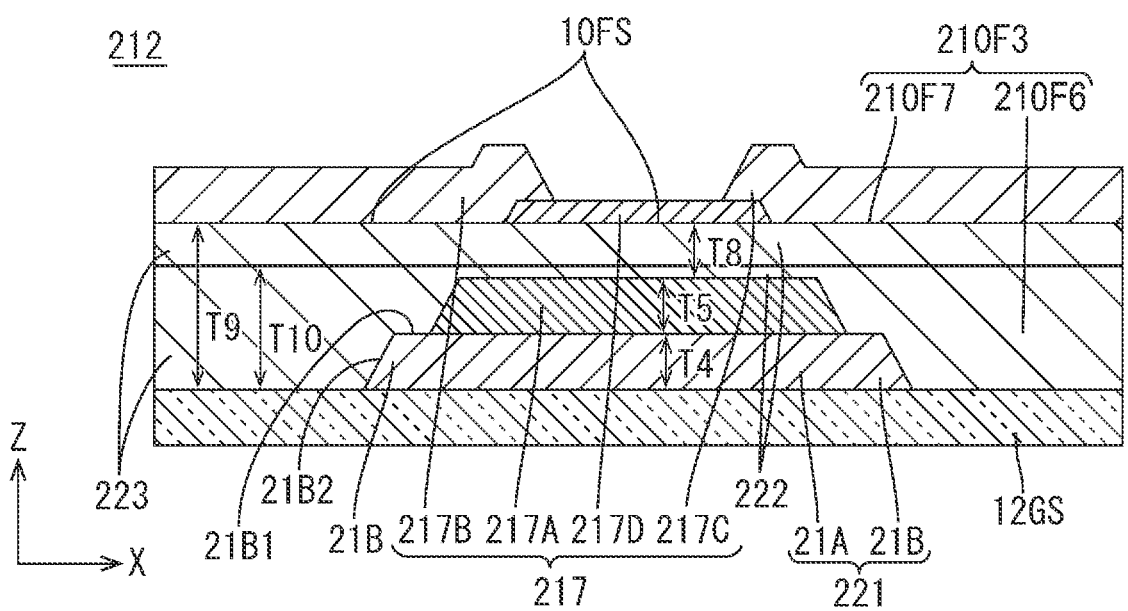
FIG. 20 is a cross-sectional view of a vicinity of a TFT in an array substrate according to a third embodiment

FIG. 20 is a cross-sectional view of a vicinity of a TFT 217 in an array substrate 212. The first insulating portion 222 according to the present embodiment includes the first gate insulating film 210F6 in addition to a second gate insulating film 210F7 as illustrated in FIG. 20. Thus, the first insulating portion 222 has a film thickness T8 that is greater than the film thickness of the second gate insulating film 210F7. A second insulating portion 223 has a film thickness T9 that is equal to the sum of the film thickness of the first gate insulating film 210F6 and the film thickness of the second gate insulating film 210F7. The portion of the second insulating portion 223 formed of the first gate insulating film 210F6 has a film thickness T10 that is greater than the sum of the thickness T4 of a lower layer portion 221 and the thickness T5 of the gate electrode 217A (T4+T5). The first gate insulating film 210F6 has the upper surface at the same height in the first insulating portion 222 and in the second insulating portion 223. That is, the underlayer of the second gate insulating film 210F7 is flattened in the range across the first insulating portion 222 and the second insulating portion 223. In addition, the upper surface of the first insulating portion 222 and the upper surface of the second insulating portion 223 constitute one flat surface 10FS. To form the first insulating portion 222 and the second insulating portion 223 as described above, the second gate insulating film 210F7 is required to be formed on the upper layer side of the first gate insulating film 210F6 that is flattened as described above. With the above configuration, a channel portion 217D, a source electrode 217B, and a drain electrode 217C disposed on the upper layer side of the second gate insulating film 210F7 can avoid having a step caused by a gate insulating film 210F3. This makes the coverage of the channel portion 217D, the source electrode 217B, and the drain electrode 217C favorable.

Next, a manufacturing method for the array substrate 212 according to the present embodiment will be described. The manufacturing method for the array substrate 212 includes a third process including a pre-process and a post-process in the same manner as in the second embodiment described above. The pre-process and the post-process of the third process will be described using FIGS. 21 to 24.

Figure 21:
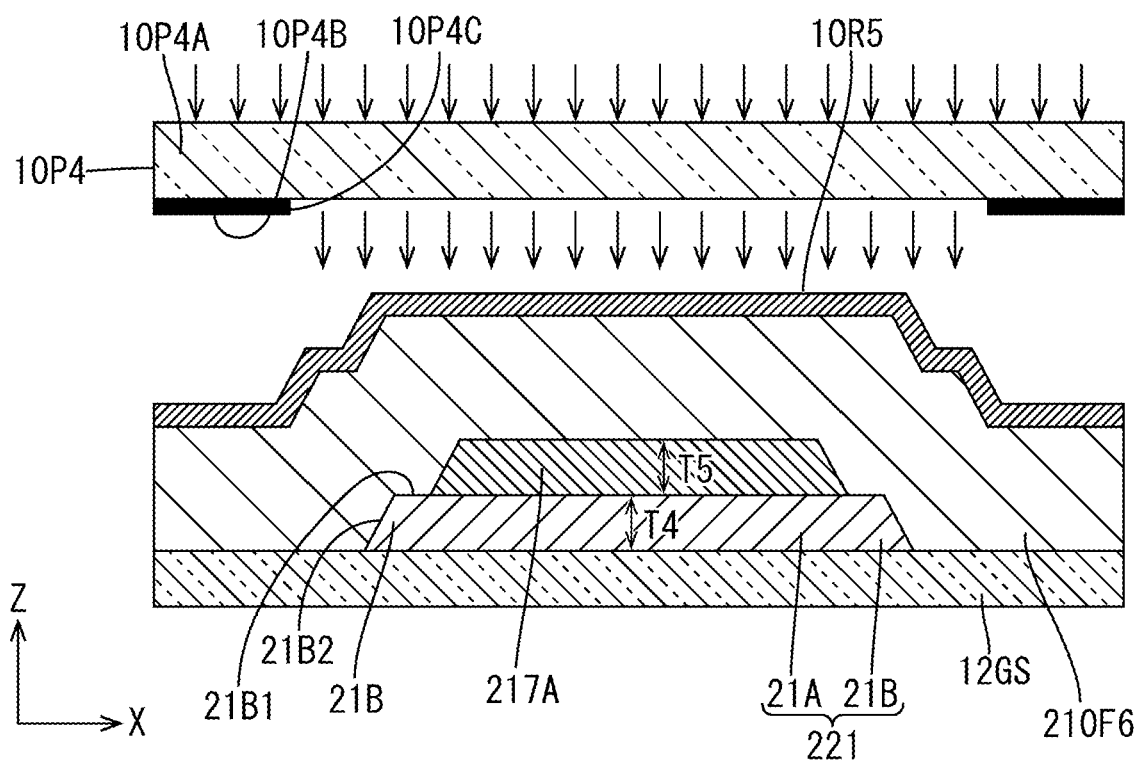
FIG. 21 is a cross-sectional view of the vicinity of the TFT illustrating a state in which pre-process of the third process has been performed, a first gate insulating film and a resist film have been formed, and the resist film is exposed.
Figure 22:
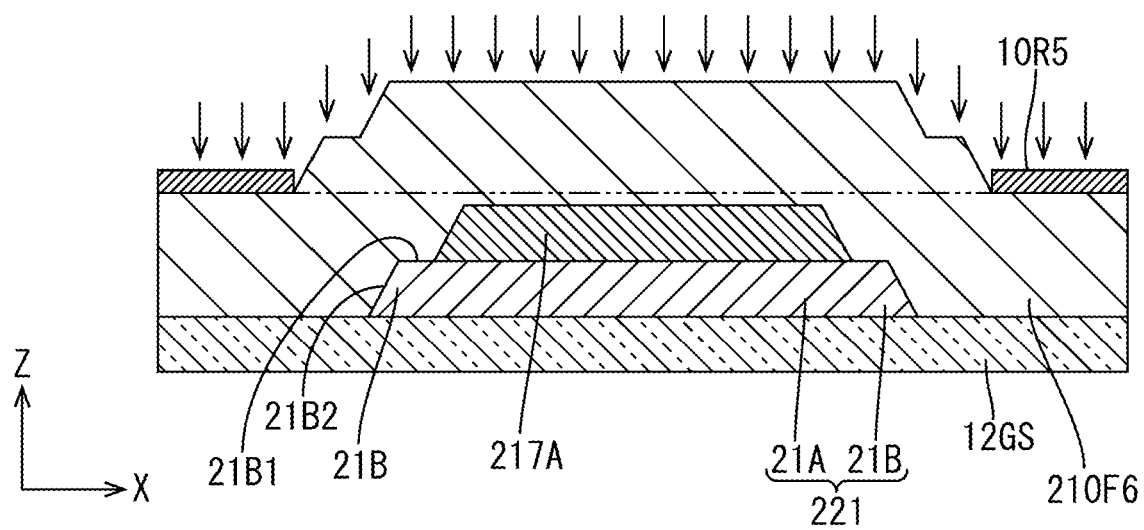
FIG. 22 is a cross-sectional view of the vicinity of the TFT illustrating a state in which the pre-process of the third process has been performed to develop the resist film, and the first gate insulating film is etched.
Figure 23:
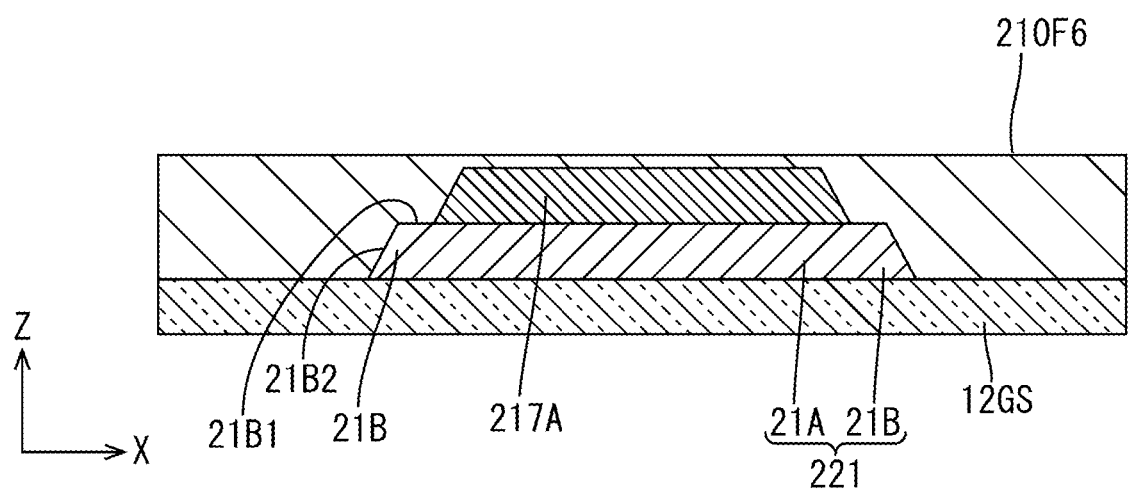
FIG. 23 is a cross-sectional view of the vicinity of the TFT illustrating a state in which the pre-process of the third process has been performed and the first gate insulating film has been etched.
Figure 24:
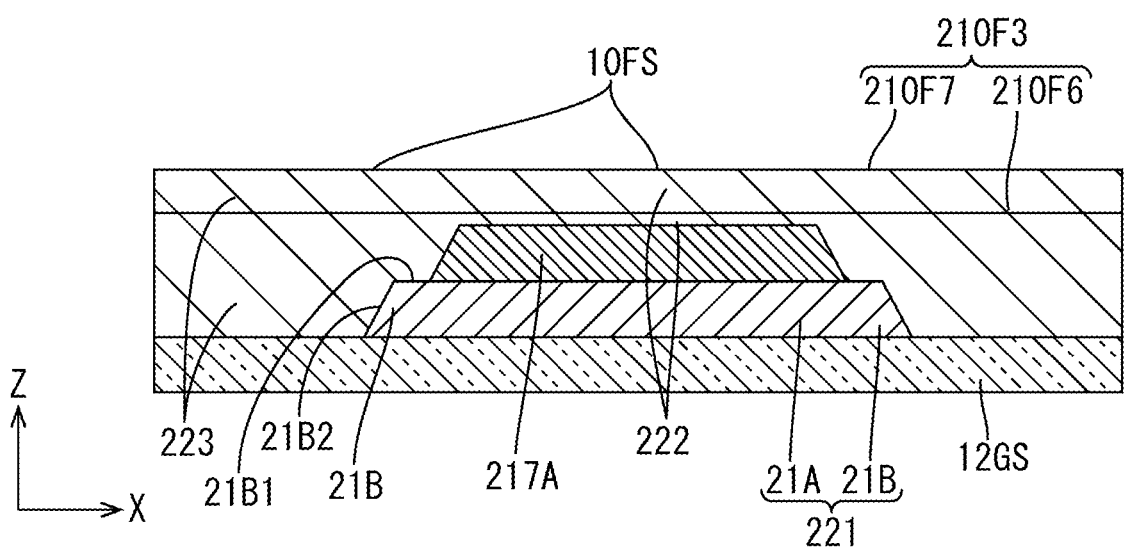
FIG. 24 is a cross-sectional view of the vicinity of the TFT illustrating a state in which the post-process of the third process has been performed and a second gate insulating film has been formed.

FIGS. 21 to 24 will be described. FIG. 21 is a cross-sectional view of a vicinity of the TFT 217 illustrating a state in which the pre-process of the third process has been performed, the first gate insulating film 210F6 and a resist film 10R5 have been formed, and the resist film 10R5 is exposed. FIG. 22 is a cross-sectional view of the vicinity of the TFT 217 illustrating a state in which the pre-process of the third process has been performed to develop the resist film 10R5, and the first gate insulating film 210F6 is etched. FIG. 23 is a cross-sectional view of the vicinity of the TFT 217 illustrating a state in which the pre-process of the third process has been performed and the first gate insulating film 210F6 has been etched. FIG. 24 is a cross-sectional view of the vicinity of the TFT 217 illustrating a state in which the post-process of the third process has been performed and the second gate insulating film 210F7 has been formed.

The pre-process of the third process will be described. In the pre-process, both the solid-like first gate insulating film 210F6 and resist film 10R5 are consecutively formed on the upper layer side of the first metal film as illustrated in FIG. 21. The first gate insulating film 210F6 is formed such that the film thickness thereof is greater than the sum of a thickness T4 of the lower layer portion 221 and a thickness T5 of the gate electrode 217A (T4+T5). The formed first gate insulating film 210F6 has a stepped portion that reflects the step of the underlayer (the lower layer portion 221 and the gate electrode 217A). The lowest position of the upper surface of the first gate insulating film 210F6 is disposed to be higher than the upper surface of the gate electrode 217A. Thereafter, the resist film 10R5 is exposed using the exposure device and a photomask 10P4. The resist film 10R5 used in the pre-process is made of a positive-working photosensitive resist material as in the second process. Because the basic configuration of the photomask 10P4 used in the pre-process is similar to that of the photomask 10P1 (see FIG. 8A, etc.) used in the second process, detailed description thereof will be omitted. A light blocking film 10P4B provided in the photomask 10P4 has a narrower formation range than the light blocking film 10P3B (see FIG. 16) given in the second embodiment described above. An opening 10P4C provided in the photomask 10P4 has a wider formation range than the opening 10P3C (see FIG. 16) given in the second embodiment described above. Specifically, the light blocking film 10P4B is disposed to overlap the flat portion of the first gate insulating film 210F6 and the resist film 10R5 around the gate electrode 217A. The opening 10P4C is disposed to overlap the portion of the first gate insulating film 210F6 and the resist film 10R5 protruding from the surrounding flat portion upward in the vicinity of the gate electrode 217A. Furthermore, the photomask 10P4 has a base material 10P4A.

In the pre-process, when exposure light emitted from the light source of the exposure device is radiated to the resist film 10R5 via the photomask 10P4 having the configuration as described above, the positive-working resist film 10R5 is selectively exposed to the light. When development is performed following the exposure, the exposed portion of the resist film 10R5 is selectively removed, whereby the resist film 10R5 is patterned as illustrated in FIG. 21.

In the pre-process, as the first gate insulating film 210F6 is etched via the developed resist film 10R5, the first gate insulating film 210F6 is patterned as illustrated in FIG. 22. When etching is performed, the exposed portion of the first gate insulating film 210F6 not covered by the resist film 10R5 is selectively thinned, and the portion thereof being covered by the resist film 10R5 and thus not exposed is selectively maintained at the original film thickness. At this time, by adjusting the etching speed and the etching time, the exposed portion of the first gate insulating film 210F6 being not covered by the resist film 10R5 is thinned until it has a target film thickness (the height indicated by the two-dot chain line in FIG. 22). As a result, the upper surface of the portion constituting the first insulating portion 222 and the upper surface of the portion constituting the second insulating portion 223 of the first gate insulating film 210F6 constitute one flat surface as illustrated in FIG. 23. The underlayer of the second gate insulating film 210F7 formed in the post-process as above is flattened in the range across the first insulating portion 222 and the second insulating portion 223. In this state, the gate electrode 217A is covered by the first gate insulating film 210F6 and thus is not exposed. Thus, the protection of the gate electrode 217A by the first gate insulating film 210F6 is achieved before the post-process is performed after the end of the pre-process.

The post-process of the third process will be described. In the post-process performed following the pre-process, the solid-like second gate insulating film 210F7 is formed on the first gate insulating film 210F6 as illustrated in FIG. 24. The second gate insulating film 210F7 is not subject to the processing (etching) performed on the first gate insulating film 210F6. For this reason, the first insulating portion 222 overlapping the gate electrode 217A and the second insulating portion 223 not overlapping the gate electrode 217A are provided. The first insulating portion 222 includes a thinned portion of the first gate insulating film 210F6 in addition to the second gate insulating film 210F7. In addition to the second gate insulating film 210F7, the second insulating portion 223 includes the portion of the first gate insulating film 210F6 with the original film thickness without being thinned. The upper surface of the first insulating portion 222 and the upper surface of the second insulating portion 223 formed as described above constitute the one flat surface 10FS. Because the underlayer of the semiconductor film and the second metal film formed in the fourth process and the fifth process performed later is flattened in this manner, the channel portion 217D, the source electrode 217B, and the drain electrode 217C formed by patterning each of the semiconductor film and the second metal film can avoid having a step caused by the gate insulating film 210F3.

The array substrate 212 according to the present embodiment described above includes the gate insulating film 210F3 having the first gate insulating film 210F6 disposed on the upper layer side of the first metal film and the second gate insulating film 210F7 disposed on the upper layer side of the first gate insulating film 210F6, the first insulating portion 222 including at least the second gate insulating film 210F7, the second insulating portion 223 including the first gate insulating film 210F6 and the second gate insulating film 210F7, the portion of the second insulating portion 223 including the first gate insulating film 210F6 has the film thickness T10 that is greater than the sum of the thickness T4 of the lower layer portion 221 and the thickness T5 of the gate electrode 217A, and the upper surface of the first insulating portion 222 and the upper surface of the second insulating portion 223 constitute the one flat surface 10FS.

With this configuration, when the first gate insulating film 210F6 is formed in the manufacturing process, the portion of the first gate insulating film 210F6 not overlapping the lower layer portion 221 and the gate electrode 217A is higher than the upper surface of the gate electrode 217A. Thereafter, the underlayer of the second gate insulating film 210F7 can be flat by selectively etching the portion of the first gate insulating film 210F6 overlapping the gate electrode 217A. Thus, when the second gate insulating film 210F7 is formed, the upper surface of the first insulating portion 222 and the upper surface of the second insulating portion 223 constitute the one flat surface 10FS. As described above, the channel portion 217D, the source electrode 217B, and the drain electrode 217C disposed on the upper layer side of the second gate insulating film 210F7 can avoid having a step caused by the gate insulating film 210F3. This makes the coverage of the channel portion 217D, the source electrode 217B, and the drain electrode 217C favorable. In addition, even when an error occurs in the film thickness T10 of the formed first gate insulating film 210F6 in the manufacturing process, the portion of the first gate insulating film 210F6 not overlapping the lower layer portion 221 and the gate electrode 217A is less likely to be lower than the upper surface of the gate electrode 217A. As a result, the certainty that the upper surface of the second gate insulating film 210F7 formed on the upper layer side of the first gate insulating film 210F6 will be flat becomes higher. In addition, the gate electrode 217A is covered by the first gate insulating film 210F6 and protected before the second gate insulating film 210F7 is formed after the first gate insulating film 210F6 is patterned.

In addition, in the manufacturing method for the array substrate 212 according to the present embodiment, the film thickness T10 of the first gate insulating film 210F6 is set to be equal to or greater than the sum of the thickness T4 of the lower layer portion 221 and the thickness T5 of the gate electrode 217A when the first gate insulating film 210F6 is formed, the portion of the first gate insulating film 210F6 overlapping the gate electrode 217A and forming the first insulating portion 222 is left when the first gate insulating film 210F6 is patterned, and the upper surface of the portion of the first gate insulating film 210F6 constituting the first insulating portion 222 and the upper surface of the portion of the first gate insulating film 210F6 constituting the second insulating portion 223 constitute the one flat surface 10FS. With this configuration, the portion of the formed first gate insulating film 210F6 not overlapping the lower layer portion 221 and the gate electrode 217A has the same height as the upper surface of the gate electrode 217A or is higher than the upper surface of the gate electrode 217A. Then, the portion of the first gate insulating film 210F6 overlapping the gate electrode 217A and forming the first insulating portion 222 is left when the first gate insulating film 210F6 is patterned, and the upper surface of the portion of the first gate insulating film 210F6 constituting the first insulating portion 222 and the upper surface of the portion of the first gate insulating film 210F6 constituting the second insulating portion 223 constitute the one flat surface 10FS. Next, when the second gate insulating film 210F7 is formed, the upper surface of the portion of the second gate insulating film 210F7 constituting the first insulating portion 222 and the upper surface of the portion of the second gate insulating film 210F7 constituting the second insulating portion 223 constitute one flat surface. Then, when the semiconductor film and the second metal film are sequentially formed and patterned on the upper layer side of the second gate insulating film 210F7 to provide the channel portion 217D, the source electrode 217B, and the drain electrode 217C, the channel portion 217D, the source electrode 217B, and the drain electrode 217C can avoid having a step caused by the gate insulating film 210F3. This makes the coverage of the channel portion 217D, the source electrode 217B, and the drain electrode 217C favorable. In addition, the gate electrode 217A is covered by the first gate insulating film 210F6 and protected before the second gate insulating film 210F7 is formed after the first gate insulating film 210F6 is patterned.

Other Embodiments

The techniques disclosed in the present specification are not limited to the embodiments described above and illustrated in the drawings, and the following embodiments, for example, are also included within the technical scope.

(1) In the first embodiment, the film thickness T2 of the second insulating portion 23 may be the same or smaller than the sum of the thickness T4 of the lower layer portion 21 and the thickness T5 of the gate electrode 17A (T4+T5).

(2) In the second embodiment, the film thickness of the first gate insulating film 10F6 may be different from that of the second gate insulating film 10F7. The first gate insulating film 10F6 may have a greater film thickness than the second gate insulating film 10F7. The first gate insulating film 10F6 may have a smaller film thickness than the second gate insulating film 10F7.

(3) In the second embodiment, the first insulating portion 122 may include the first gate insulating film 10F6 and the second gate insulating film 10F7.

(4) In the second and third embodiments, the material of the first gate insulating films 10F6 and 210F6 may be different from that of the second gate insulating films 10F7 and 210F7.

(5) In the third embodiment, the first insulating portion 222 may be constituted only by the second gate insulating film 210F7. In this case, the film thickness of the portion of the second insulating portion 223 constituted by the first gate insulating film 210F6 may be equal to the sum of the thickness T4 of the lower layer portion 221 and the thickness T5 of the gate electrode 217A (T4+T5).

(6) The formation ranges and the cross-sectional shapes of the non-overlapping portions 21B of the lower layer portions 21, 121, and 221 can be changed as appropriate in addition to those illustrated.

(7) Each of the lower layer portions 21, 121, and 221 may be constituted only by the overlapping portion 21A without having the non-overlapping portion 21B.

(8) When a base coat film or the like is formed in the lowest layers of the array substrates 12, 112, and 212, the base coat film or the like serves as the underlayers of the lower layer portions 21, 121, and 221. That is, the underlayers of the lower layer portions 21, 121, and 221 may be other than the glass substrates 12GS and 112GS.

(9) A lower layer wiring line made of a portion of the lower layer film 10F1 different from the lower layer portions 21, 121, and 221 may be provided on the lower layer side of the gate wiring line 15.

(10) The third insulating portion 24 may also be interposed between a first wiring line (e.g., a capacitance wiring line or the like) made of the first metal film 10F2 other than the gate wiring line 15 and the source wiring line 16 at the intersection of the first wiring line and the source wiring line 16.

(11) The third insulating portion 24 may also be interposed between the intersection of a second wiring line (e.g., a common wiring line that transmits a common signal to a common electrode or the like) made of the second metal film 10F5 other than the source wiring line 16 and the gate wiring line 15 at the intersection of the second wiring line and the gate wiring line 15.

(12) A proportion of the number of the first terminal portions 25a occupying the plurality of terminal portions 25 may be different from a proportion of the number of the second terminal portions 25S.

(13) All of the plurality of terminal portions 25 may the first terminal portions 25a.

(14) A plurality of the first terminal portions 25a may be disposed adjacent to each other. Likewise, a plurality of the second terminal portions 25S may be disposed adjacent to each other.

(15) The terminal portions 25 may have a layered structure of the first metal film 10F2 and the second metal film 10F5. Furthermore, the top layer of the terminal portions 25 is preferably covered by a transparent electrode film of the pixel electrode 18 to prevent corrosion.

(16) The gate insulating films 10F3, 110F3, and 210F3 may be a layered film having three or more layers.

(17) The material of the lower layer film 10F1 may be an insulating material, an organic material, a resist material, or the like.

(18) The material of the resist films 10R1, 10R2, 10R3, 10R4, and 10R5 may be a negative-working photosensitive resist material.

(19) An organic EL display panel may be employed, instead of the liquid crystal panel 10.

(20) A thin film transistor substrate of a device other than the display panel 10 may be employed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A thin film transistor substrate comprising:
a substrate; and
a thin film transistor of a bottom gate type, the thin film transistor including a gate electrode, a channel portion, a source electrode, and a drain electrode formed on the substrate,
wherein a gate insulating film is disposed between the gate electrode and the channel portion,
the gate electrode is made of a first conductive film disposed on a lower layer side of the gate insulating film,
the channel portion is made of a semiconductor film disposed on an upper layer side of the gate insulating film, and the channel portion is disposed to overlap the gate electrode,
the source electrode is made of a second conductive film disposed on an upper layer side of the semiconductor film, and the source electrode is disposed such that to include at least a portion overlapping the channel portion,
the drain electrode is made of a portion of the second conductive film that is different from a portion of the source electrode, and is disposed such that to include at least a portion overlapping the channel portion at a position spaced from the source electrode,
the gate insulating film includes a first insulating portion overlapping the gate electrode and a second insulating portion that is disposed not to overlap the gate electrode but to overlap the source electrode and the drain electrode, and that has a film thickness greater than a film thickness of the first insulating portion,
a lower layer portion that is made of a lower layer film disposed on a lower layer side of the first conductive film and that includes at least a portion overlapping the gate electrode,
the gate insulating film includes a first gate insulating film disposed on an upper layer side of the first conductive film, and a second gate insulating film disposed on an upper layer side of the first gate insulating film,
the first insulating portion includes at least the second gate insulating film,
the second insulating portion includes the first gate insulating film and the second gate insulating film,
a portion of the second insulating portion formed by the first gate insulating film has a film thickness that is equal to or greater than a sum of a thickness of the lower layer portion and a thickness of the gate electrode, and
an upper surface of the first insulating portion and an upper surface of the second insulating portion form one flat surface.

2. The thin film transistor substrate according to claim 1, wherein the lower layer portion includes an overlapping portion overlapping the gate electrode and a non-overlapping portion not overlapping the gate electrode.

3. The thin film transistor substrate according to claim 1, further comprising:
a first wiring line made of a portion of the first conductive film that is different from a portion of the gate electrode;
a second wiring line made of a portion of the second conductive film that is different from the portion of the source electrode and a portion of the drain electrode, the second wiring line intersecting the first wiring line; and
a third insulating portion made of a portion of the gate insulating film that is different from a portion of the first insulating portion and a portion of the second insulating portion, the third insulating portion interposed between the first wiring line and the second wiring line at an intersection of the first wiring line and the second wiring line, the third insulating portion having a film thickness identical to the film thickness of the second insulating portion.

4. The thin film transistor substrate according to claim 1, further comprising:

a plurality of terminal portions made of a portion of the first conductive film that is different from a portion of the gate electrode, the plurality of terminal portions arranged at intervals; and a second lower layer portion made of a portion of the lower layer film that is different from a portion of the lower layer portion, the second lower layer portion disposed to include at least a portion overlapping at least one of the plurality of terminal portions.

5. The thin film transistor substrate according to claim 1, wherein the portion of the second insulating portion formed by the first gate insulating film has a film thickness greater than the sum of the thickness of the lower layer portion and the thickness of the gate electrode, and the first insulating portion further includes the first gate insulating film.

6. The thin film transistor substrate according to claim 1, further comprising:

a gate wiring line made of a portion of the first conductive film that is different from a portion of the gate electrode, the gate wiring line connected to the gate electrode, wherein the lower layer portion is made of a conductive material.

7. A display device comprising:

the thin film transistor substrate according to claim 1; and a counter substrate disposed to face the thin film transistor substrate.

8. A manufacturing method for a thin film transistor substrate, the manufacturing method comprising:

forming a lower layer film on a substrate and patterning the lower layer film to provide a lower layer portion;

forming a first conductive film on an upper layer side of the lower layer film and patterning the first conductive film to provide a gate electrode overlapping at least a portion of the lower layer portion, the gate electrode forming a thin film transistor of a bottom gate type;

forming a first gate insulating film on an upper layer side of the first conductive film, patterning a portion of the first gate insulating film overlapping the gate electrode to be selectively etched, and then forming a second gate insulating film on an upper layer side of the first gate insulating film to provide a first insulating portion overlapping the gate electrode, the first insulating portion at least including the second gate insulating film, and to provide a second insulating portion disposed not to overlap the gate electrode, the second insulating portion including the first gate insulating film and the second gate insulating film, the second insulating portion having a film thickness greater than a film thickness of the first insulating portion;

forming a semiconductor film on an upper layer side of the second gate insulating film and patterning the semiconductor film to provide a channel portion disposed to overlap the gate electrode, the channel portion forming the thin film transistor; and forming a second conductive film on an upper layer side of the semiconductor film and patterning the second conductive film to provide a source electrode disposed such that to include at least a portion overlapping the channel portion, the source electrode forming the thin film transistor, and to provide a drain electrode disposed such that to include at least a portion overlapping the channel portion at a position spaced from the source electrode, the drain electrode forming constituting the thin film transistor, wherein, in forming the first gate insulating film, a film thickness of the first gate insulating film is set to be equal to or greater than a sum of a thickness of the lower layer portion and a thickness of the gate electrode, and in patterning the portion of the first gate insulating film, the portion of the first gate insulating film overlapping the gate electrode and forming the first insulating portion is left, and an upper surface of the portion of the first gate insulating film forming the first insulating portion and an upper surface of a portion of the first gate insulating film forming the second insulating portion form one flat surface.

* * * * *